United States Patent [19]

Eda et al.

[11] Patent Number: 5,446,330

[45] Date of Patent: Aug. 29, 1995

[54] SURFACE ACOUSTIC WAVE DEVICE HAVING A LAMINATION STRUCTURE

[75] Inventors: Kazuo Eda, Nara; Yutaka Taguchi; Keiji Onishi, both of Settsu; Shun-ichi Seki, Osaka, all of Japan

[73] Assignee: Matsushita Electric Industrial Co., Ltd., Kadoma, Japan

[21] Appl. No.: 213,218

[22] Filed: Mar. 15, 1994

[30] Foreign Application Priority Data

Mar. 15, 1993 [JP] Japan .................. 5-053431

[51] Int. Cl.[6] ............................................. H01L 41/08
[52] U.S. Cl. ................................................. 310/313 R
[58] Field of Search ................. 310/313 A, 313 R; 333/155

[56] References Cited

U.S. PATENT DOCUMENTS

| | | | |
|---|---|---|---|
| 4,037,176 | 7/1977 | Ono et al. | 310/313 A |
| 4,128,819 | 12/1978 | Shiokawa et al. | 310/313 R |
| 4,516,049 | 5/1985 | Mikoshiba et al. | 310/313 A |
| 5,329,208 | 7/1994 | Imai et al. | 310/313 R |
| 5,373,579 | 12/1994 | Eda | 385/131 |

FOREIGN PATENT DOCUMENTS

| | | | |
|---|---|---|---|
| 0313025 | 4/1989 | European Pat. Off. | H03H 9/02 |
| 6027985 | 3/1981 | Japan | 310/313 R |
| 0149109 | 11/1981 | Japan | 333/155 |
| 0092021 | 5/1986 | Japan | 333/155 |
| 64-62911 | 3/1989 | Japan | H03H 9/25 |
| 2110033 | 6/1983 | United Kingdom | H03H 9/02 |

OTHER PUBLICATIONS

"LiNbO$_3$-Quartz-LiNbO$_3$ Composite Delay Line with Zero Linear Temperature Coefficient of Delay", by M. Wauk, Mar. 4, 1974, pp. 109-110, Electronics Letters Apr. 4, 1974, vol. 10, No. 7.

S. Fujishima, "An Overview of Japanese Manufacturing of Saw Devices", *IEEE-MTT-S International Microwave Symposium Digest*, pp. 561-564, (Jun. 2-4, 1986).

G. G. Goetz et al., "Generalized Bonding", *1989 IEEE SOS/SOI Technology Conference*, pp. 125-126 (Oct. 3-5, 1989).

European Search Report corresponding to European Patent No. 94104005.7 (Jul. 11, 1994).

A. Armstrong, "High coupling Efficiency for Zinc Oxide Overlays on Lithium Niobate", *1972 Ultrasonics Symposium Proceedings*, pp. 370-372 (1972).

Primary Examiner—Thomas M. Dougherty
Attorney, Agent, or Firm—Ratner & Prestia

[57] ABSTRACT

A surface acoustic wave device includes: a single crystal piezoelectric substrate; a single crystal piezoelectric thin plate formed on the single crystal piezoelectric substrate, the single crystal piezoelectric thin plate being bonded to the single crystal piezoelectric substrate by direct bonding; and interdigital transducers formed on the single crystal piezoelectric thin plate, for exciting a surface acoustic wave in at least the single crystal piezoelectric thin plate.

42 Claims, 8 Drawing Sheets

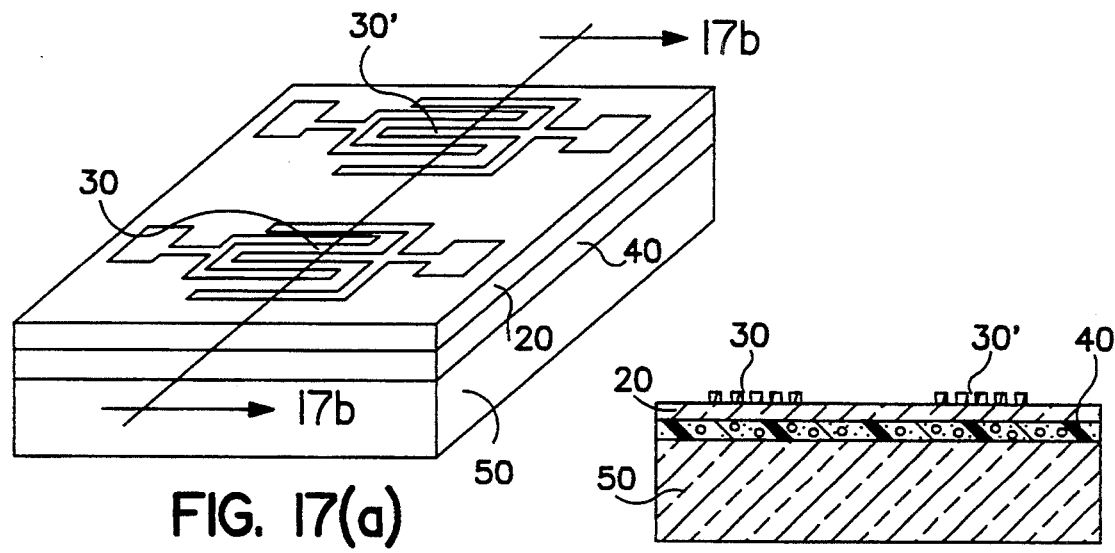
FIG. 17(a)
FIG. 17(b)
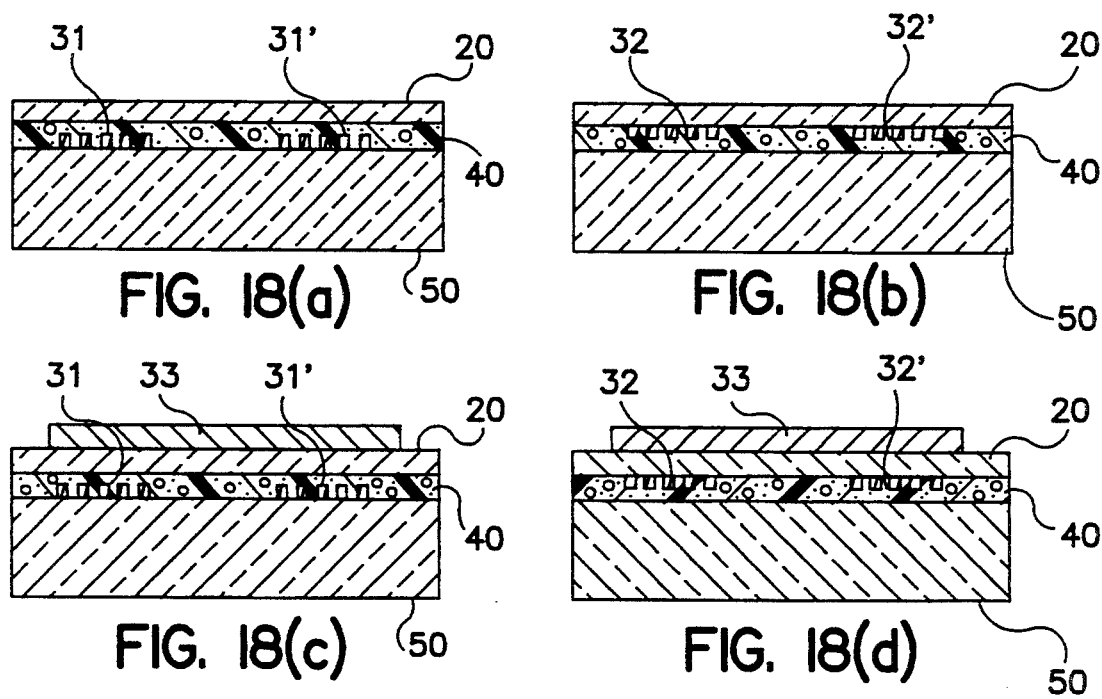
FIG. 18(a)
FIG. 18(b)
FIG. 18(c)
FIG. 18(d)
FIG. 18(e)

SURFACE ACOUSTIC WAVE DEVICE HAVING A LAMINATION STRUCTURE

BACKGROUND OF THE INVENTION

1. Field of the Invention

The present invention relates to a surface acoustic wave device used as a filter or a resonator.

2. Description of the Related Art

Advancements in mobile communication technologies in recent years have been causing communication equipment to become much more compact and operate at higher frequencies. Such equipment requires oscillators and high-frequency filters as indispensable components, and often includes surface acoustic wave devices.

Conventional surface acoustic wave devices, such as surface acoustic wave filters and surface acoustic wave resonators, are made by forming interdigital transducers on a piezoelectric substrate such as lithium niobate or lithium tantalate, whereon the surface acoustic wave is generated by applying an alternate electric field to the interdigital transducers. A surface acoustic wave device used in mobile communication equipment must have good operational characteristics in the high frequency range. High-frequency characteristics of a surface acoustic wave is evaluated as an insertion loss and the temperature dependence thereof in the case of a filter. In the case of a resonator, high-frequency characteristics are evaluated as a resonation Q value which corresponds to the inverse of loss, a ratio of resonance to anti-resonance (capacity ratio), and the temperature dependances thereof. The capacity ratio has a direct effect on frequency pass-band. The insertion loss, the resonation Q, and the capacity ratio depend on the electromechanical coupling factor of the piezoelectric material. The temperature dependence of these parameters have a relation to the temperature dependence of the acoustic velocity of the piezoelectric material to be used.

With respect to the production process of surface acoustic wave devices, the line width of an interdigital transducer depends on the sound velocity of a piezoelectric substrate, therefore the sound velocity of the piezoelectric substrate is also important in order to facilitate a fine patterning process such as photolithography.

The electromechanical coupling factor, the temperature dependence, and the sound velocity are largely dependent on the type and crystal orientation of the material used. In the case of lithium niobate, under the conditions of 64-degree Y-cut and X-propagation, the electromechanical coupling factor is 11.3%, the temperature dependence is 70 ppm/° C., and the sound velocity is 4,742 m/sec. Under the conditions of 128-degree Y-cut and X-propagation, the electromechanical coupling factor is 5.5%, the temperature dependence is 75 ppm/° C., and the sound velocity is 3,980 m/sec. In the case of lithium tantalate, under the conditions of 36-degree Y-cut and X-propagation, the electromechanical coupling factor is 5.0%, the temperature dependence is 30 ppm/° C., and the sound velocity is 4,160 m/sec. With quartz, under the conditions of 42.5-degree Y-cut and X-propagation, the electromechanical coupling factor is 0.15%, the temperature dependence is 0 ppm/° C., and the sound velocity is 3,158 m/sec. With lithium borate, under the conditions of 45-degree X-cut, the electromechanical coupling factor is 1.0%, and the sound velocity is about 3,401 m/sec.

From the view point of the electromechanical coupling factor, generally, it is preferable to use lithium niobate. However, lithium niobate is inferior in temperature dependence to quartz, etc. Quartz has a very small temperature dependence, but has a small electromechanical coupling factor. As the sound velocity is higher, interdigital transducers in a resonator or filter for a high frequency can have a wider line width. From the view point of the sound velocity, therefore, it is preferable to use lithium niobate of 64-degree Y-cut and X-propagation.

From the view point of the flexibility of design, it is preferable to use a material which has a large electromechanical coupling factor, a small temperature dependence, and a high sound velocity. However, the above-mentioned materials are insufficient for satisfying these requirements.

In a prior art piezoelectric substrate composed of a single material, the combination of the electromechanical coupling factor and the temperature dependence is limited in number, and hence the flexibility of design is low. Furthermore, there are problems in that a material which has a large electromechanical coupling factor and a small temperature dependence has not been found, and that a piezoelectric substrate of a high sound velocity has not been developed.

In order to solve these problems, surface acoustic wave devices of a lamination structure have been developed. For example, a configuration has been reported in which piezoelectric films are laminated on a non-piezoelectric made of a material of a high sound velocity such as sapphire or diamond, thereby obtaining a surface acoustic wave substrate of a high sound velocity (for example, Japanese Laid-Open Patent publication No. 64-62,911). In such a device, as a piezoelectric film, a thin film made of ZnO or AlN is formed of by a thin film forming technique such as a sputtering method or a chemical vapor deposition (CVD) method.

A lamination structure of ZnO and lithium niobate which constitute a lamination of piezoelectric materials is reported by A. Armstrong et al. (Proc. 1972 IEEE Ultrasonics Symp. (IEEE, New York, 1972) p. 370). According to this configuration, a surface acoustic wave device having an excellent electromechanical coupling factor can be obtained.

In a known method of improving the temperature characteristics, an AlN film which is a piezoelectric material is formed on an Si semiconductor substrate, and a film of silicon oxide is formed on the AlN film (U.S. Pat. No. 4,516,049).

All of these prior art surface acoustic wave devices have a lamination structure which is formed by one of various thin film forming techniques such as sputtering, and CVD methods. In this formation, combinations of a substrate and a material are strictly restricted. For example, a piezoelectric film formed by the sputtering method or the like is inferior in piezoelectric characteristics to a bulk single crystal. In order to exhibit piezoelectric characteristics, moreover, it is required to attain at least uniform orientation of the crystal orientation. However, such an orientation can be accomplished by a very restricted range of combinations of a substrate and a film. Preferably, a single crystal thin film is formed by an epitaxial growth technique. In this formation, combinations of a substrate and a film are further restricted. With respect to piezoelectric materials such as quartz, lithium niobate, lithium tantalate, and lithium borate which are used in conventional surface acoustic wave devices, for example, excellent epitaxial films have not been obtained when a different substrate material is used. Also in this case, therefore, there are problems in that the flexibility of design is low, and the types of materials with a large electromechanical coupling factor and a superior temperature dependence and excellent in sound velocity are limited.

With respect to these characteristics, it is known that a substrate having a large electromechanical coupling factor can be obtained by laminating a piezoelectric material having a large electromechanical coupling factor such as PZT, on a substrate of a dielectric or semiconductor material. Actually, there is no means for realizing such configuration. When one of the above-mentioned thin film forming techniques is employed, it is required to conduct the formation while orienting the piezoelectric material in a specified direction. Since combinations of the piezoelectric substrate material and a substrate are strictly restricted, no practical device has been obtained. When an adhesive is employed, the adhesive enters the interface for propagation of a surface acoustic wave so that the surface acoustic wave is attenuated, resulting in that preferable characteristics cannot be obtained.

SUMMARY OF THE INVENTION

The surface acoustic wave device of this invention, includes: a single crystal piezoelectric substrate; a single crystal piezoelectric thin plate formed on the single crystal piezoelectric substrate, the single crystal piezoelectric thin plate being bonded to the single crystal piezoelectric substrate by direct bonding; and interdigital transducers formed on the single crystal piezoelectric thin plate, for exciting a surface acoustic wave in at least the single crystal piezoelectric thin plate.

In one embodiment of the invention, surfaces of the single crystal piezoelectric thin plate and the single crystal piezoelectric substrate are subjected to flattening, mirror-polishing, cleaning, and hydrophilic processes and the single crystal piezoelectric thin plate and the single crystal piezoelectric substrate constitute a lamination structure by stacking the single crystal piezoelectric thin plate and the single crystal piezoelectric substrate and then by conducting a heat treatment.

In another embodiment of the invention, the single crystal piezoelectric thin plate has a different sound velocity from that of the single crystal piezoelectric substrate.

In still another embodiment of the invention, the temperature dependence of the sound velocity of the single crystal piezoelectric thin plate is greater than that of the single crystal piezoelectric substrate.

In still another embodiment of the invention, the electromechanical coupling factor of the single crystal piezoelectric thin plate is greater than that of the single crystal piezoelectric substrate.

In still another embodiment of the invention, each of the single crystal piezoelectric substrate and the single crystal piezoelectric thin plate is made of a material selected from the group consisting of lithium niobate, lithium tantalate, lithium borate, and quartz.

In still another embodiment of the invention, the single crystal piezoelectric thin plate is made of lithium niobate, and the single crystal piezoelectric substrate is made of quartz.

In still another embodiment of the invention, the thickness of the single crystal piezoelectric thin plate is less than three times of the wavelength of the surface acoustic wave excited therein.

According to another aspect of the invention, a surface acoustic wave device includes: a single crystal piezoelectric substrate; a single crystal piezoelectric thin plate; an inorganic thin film layer formed between the single crystal piezoelectric substrate and the single crystal piezoelectric thin plate, at least one of the single crystal piezoelectric substrate and the single crystal piezoelectric thin plate being bonded to the inorganic thin film layer by direct bonding; and interdigital transducers being in contact with one of the single crystal piezoelectric thin plate and the single crystal piezoelectric substrate, the interdigital transducers exciting a surface acoustic wave in at least the single crystal piezoelectric thin plate.

In one embodiment of the invention, a surface of the inorganic thin film layer and at least one of surface of the single crystal piezoelectric thin plate and surface of the single crystal piezoelectric substrate are subjected to flattening, mirror-polishing, cleaning, and hydrophilic processes and the single crystal piezoelectric thin plate, the single crystal piezoelectric substrate, and the inorganic thin film layer constitute a lamination structure by stacking the single crystal piezoelectric thin plate and the single crystal piezoelectric substrate and then by conducting a heat treatment.

In another embodiment of the invention, the inorganic thin film layer has a thickness equal to or less than half of the wavelength of the surface acoustic wave.

In still another embodiment of the invention, the inorganic thin film layer is made of materials including silicon.

In still another embodiment of the invention, the interdigital transducers are formed between the inorganic thin film layer and one of the single crystal piezoelectric thin plate and the single crystal piezoelectric substrate.

In still another embodiment of the invention, the surface acoustic wave device further includes a ground electrode being in contact with one of the single crystal piezoelectric thin plate and the single crystal piezoelectric substrate.

In still another embodiment of the invention, the inorganic thin film layer is made of one of silicon oxide and silicon nitride.

In still another embodiment of the invention, the sound velocity of the single crystal piezoelectric thin plate is different from that of the single crystal piezoelectric substrate.

In still another embodiment of the invention, the temperature dependence of the sound velocity of the single crystal piezoelectric thin plate is greater than that of the single crystal piezoelectric substrate.

In still another embodiment of the invention, the electromechanical coupling factor of the single crystal piezoelectric thin plate is greater than that of the single crystal piezoelectric substrate.

In still another embodiment of the invention, each of the single crystal piezoelectric thin plate and the single crystal piezoelectric substrate is made of a material selected from the group consisting of lithium niobate, lithium tantalate, lithium borate, and quartz.

In still another embodiment of the invention, the single crystal piezoelectric thin plate is made of lithium niobate, and the single crystal piezoelectric substrate is made of quartz.

In still another embodiment of the invention, the single crystal piezoelectric thin plate has a thickness equal to or less than three times of the wavelength of the surface acoustic wave.

According to still another aspect of the invention, a surface acoustic wave device includes: a non-piezoelectric substrate; a single crystal piezoelectric thin plate formed on the non-piezoelectric, the single crystal piezoelectric thin plate being bonded to the non-piezoelectric by direct bonding; and interdigital transducers formed on the single crystal piezoelectric thin plate, for exciting a surface acoustic wave in at least the single crystal piezoelectric thin plate.

In one embodiment of the invention, surfaces of the single crystal piezoelectric thin plate and the non-piezoelectric are subjected to flattening, mirror-polishing, cleaning, and hydrophilic processes and the single crystal piezoelectric thin plate and the non-piezoelectric constitute a lamination structure by stacking the single crystal piezoelectric thin plate and the non-piezoelectric and then by conducting a heat treatment.

In another embodiment of the invention, the single crystal piezoelectric thin plate has a lower sound velocity than that of the non-piezoelectric.

In still another embodiment of the invention, the single crystal piezoelectric thin plate has a higher sound velocity than that of the non-piezoelectric.

In still another embodiment of the invention, the single crystal piezoelectric thin plate is made of a material selected from the group consisting of lithium niobate, lithium tantalate, lithium borate, and quartz.

In still another embodiment of the invention, the non-piezoelectric is made of a material selected from the group consisting of boron, amorphous carbon, and graphite.

In still another embodiment of the invention, the single crystal piezoelectric thin plate has a thickness equal to or less than the wavelength of the surface acoustic wave excited therein.

In still another embodiment of the invention, the single crystal piezoelectric thin plate has a greater thermal expansion coefficient than that of the non-piezoelectric.

According to still another aspect of the invention, a surface acoustic wave device includes: a non-piezoelectric substrate; a single crystal piezoelectric thin plate; an inorganic thin film layer formed between the non-piezoelectric and the single crystal piezoelectric thin plate, at least one of the non-piezoelectric and the single crystal piezoelectric thin plate being bonded to the inorganic thin film layer by direct bonding; and interdigital transducers being in contact with one of the single crystal piezoelectric thin plate and the non-piezoelectric, the interdigital transducers exciting a surface acoustic wave in at least the single crystal piezoelectric thin plate.

In one embodiment of the invention, a surface of the inorganic thin film layer and at least one of surface of the single crystal piezoelectric thin plate and surface of the non-piezoelectric are subjected to flattening, mirror-polishing, cleaning, and hydrophilic processes and the single crystal piezoelectric thin plate, the non-piezoelectric, and the inorganic thin film layer constitute a lamination structure by stacking the single crystal piezoelectric thin plate and the non-piezoelectric and then by conducting a heat treatment.

In another embodiment of the invention, the inorganic thin film layer has a thickness equal to or less than half of the wavelength of the surface acoustic wave.

In still another embodiment of the invention, the inorganic thin film layer is made of materials including silicon.

In still another embodiment of the invention, the surface acoustic wave device further includes a ground electrode being in contact with one of the single crystal piezoelectric thin plate and the non-piezoelectric.

In still another embodiment of the invention, the inorganic thin film layer is made of one of silicon oxide and silicon nitride.

In still another embodiment of the invention, the single crystal piezoelectric thin plate has a lower sound velocity than that of the non-piezoelectric.

In still another embodiment of the invention, the single crystal piezoelectric thin plate has a higher sound velocity than that of the non-piezoelectric.

In still another embodiment of the invention, wherein the single crystal piezoelectric thin plate is made of a material selected from the group consisting of lithium niobate, lithium tantalate, lithium borate, and quartz.

In still another embodiment of the invention, the non-piezoelectric is made of a material selected from the group consisting of boron, amorphous carbon, and graphite.

In still another embodiment of the invention, the single crystal piezoelectric thin plate has a thickness equal to or less than the wavelength of the surface acoustic wave excited therein.

In still another embodiment of the invention, the single crystal piezoelectric thin plate has a greater thermal expansion coefficient than that of the non-piezoelectric.

According to the invention, a surface acoustic wave device can be composed of a wide variety of composite single crystal piezoelectric substrates and non-piezoelectrics by adequately combining the piezoelectric characteristics, the sound velocities, the temperature dependences, and the thermal expansion coefficients of the single crystal piezoelectric substrates.

Thus, the invention described herein makes possible the advantage of providing a surface acoustic wave device having a high flexibility of design without limiting a specific combination of the piezoelectric characteristic, the sound velocity, the temperature dependence, and the thermal expansion coefficient.

This and other advantages of the present invention will become apparent to those skilled in the art upon reading and understanding the following detailed description with reference to the accompanying figures.

BRIEF DESCRIPTION OF THE DRAWINGS

FIG. 17(a) shows a perspective view for illustrating the configuration of the surface acoustic wave device according to Example 4 of the invention.

FIG. 17(b) shows a cross-sectional view taken along a line A-A' in FIG. 17(a).

FIGS. 18(a) through 18(e) show cross-sectional views for illustrating specific configurations of inter digital transducers in the surface acoustic wave device according to Example 2.

DESCRIPTION OF THE PREFERRED EMBODIMENTS

Hereinafter, the configurations of surface acoustic wave devices of examples of the invention and methods of producing the devices will be described with reference to the drawings.

EXAMPLE 1

Figure 1A:
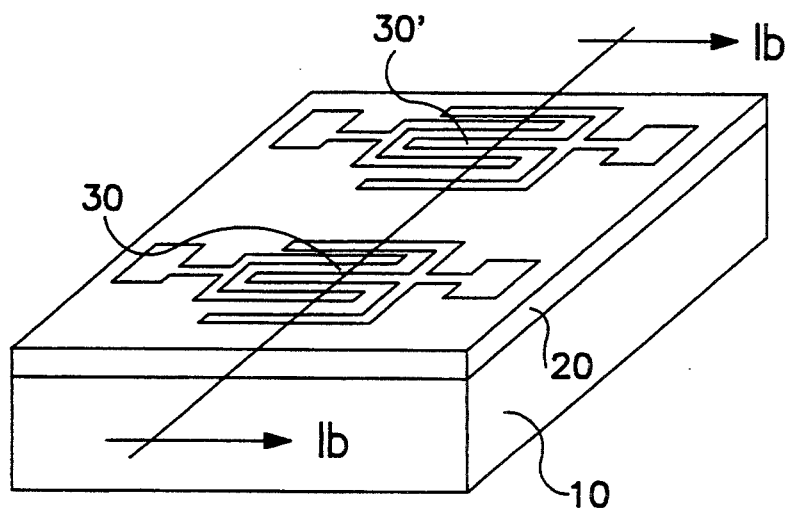
FIG. 1(a) shows a perspective view for illustrating the configuration of the surface acoustic wave device according to Example 1 of the invention.
Figure 1B:
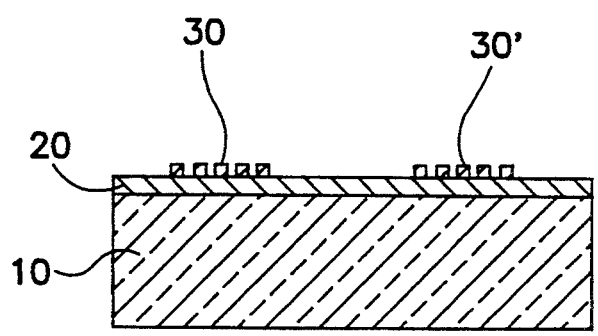
FIG. 1(b) shows a cross-sectional view taken along a line A-A' in FIG. 1(a).

FIG. 1(a) is a perspective view of a first example of the configuration of the surface acoustic wave device of the invention, and FIG. 1(b) shows a section structure of the A-A' portion in FIG. 1(a).

Referring to FIGS. 1(a) and 1(b), the surface acoustic wave device of the invention includes a single crystal piezoelectric substrate 10, a single crystal piezoelectric thin plate 20, and interdigital transducers 30 and 30'. The single crystal piezoelectric thin plate 20 is actually a substrate for exciting a surface acoustic wave and is thinned. In order to distinguish the substrate from the single crystal piezoelectric substrate 10, the substrate is hereinafter referred to as a single crystal piezoelectric thin plate 20. The single crystal piezoelectric thin plate 20 is formed on the single crystal piezoelectric substrate 10. The interdigital transducers 30 and 30' are disposed on the single crystal piezoelectric thin plate 20. In FIGS. 1(a) and 1(b), the interdigital transducers 30 and 30' are shown in a simplified manner for clarity, as the actual construction of the interdigital transducers 30 and 30' are well known.

Suitable materials for the single crystal piezoelectric substrate 10 and the single crystal piezoelectric thin plate 20, are lithium niobate, lithium tantalate, lithium borate, and quartz.

The device functions as a surface acoustic wave device in the following way. A high frequency signal is applied to the interdigital transducer 30 so that a surface acoustic wave is excited in the piezoelectric portion in the vicinity of the interdigital transducer 30. The surface acoustic wave propagates to the other interdigital transducer 30' through the lamination structure, and is then inverted into an electric signal in the piezoelectric portion under the interdigital transducer 30'. In this description, a fundamental configuration of a surface acoustic wave device using interdigital transducers is illustrated. When such a device is actually used in a high frequency filter or a resonator, the number of the interdigital transducers is increased and the configuration is modified.

The single crystal piezoelectric substrate 10 and the single crystal piezoelectric thin plate 20 formed on the single crystal piezoelectric substrate 10 are obtained in the following way. Two single crystal piezoelectric substrates each having a thickness which is suitable for handling are prepared, and the surfaces of the substrates are subjected to flattening, mirror-polishing, cleaning, and hydrophilic processes. The two substrates are then bonded by direct bonding with each other by stacking them and conducting a heat treatment, so as to form a lamination. Thereafter, the single crystal piezoelectric thin plate 20 is polished and thinned to a predetermined thickness.

After forming a lamination structure consisting of the single crystal piezoelectric substrate 10 and the single crystal piezoelectric thin plate 20, the interdigital transducers 30 and 30' are formed on the single crystal piezoelectric thin plate 20 by a lithographic technique. The interdigital transducers 30 and 30' are made of aluminum, gold, or the like.

The meaning of the direct bonding will be described. At first, a production process for the direct bonding will be described. A specific example will be described in which single crystal lithium niobate, lithium tantalate, lithium borate, or quartz is used as a material of the single crystal piezoelectric substrate.

The surfaces of two single crystal piezoelectric substrates which are to be directly bonded are flattened, mirror-polished, and cleaned. As required, the surface layers are etched away. When lithium niobate, lithium tantalate, or quartz is to be etched, a hydrofluoric etchant is used. When lithium borate is to be etched, a weak acid is used. Then, the surfaces are subjected to a process of making them hydrophilic. Specifically, the materials are soaked in an ammonia-hydrogen peroxide solution to cause a hydroxyl group to easily be attached to the surfaces or make the surfaces hydrophilic. Thereafter, the surfaces are cleaned sufficiently by pure water, resulting in hydroxyl groups be attached to the surfaces of the single crystal piezoelectric substrates. The two single crystal piezoelectric substrates are stacked together under this state, so that the two substrates stick to each other mainly by van der Waals forces. Although the substrates are strongly bonded to each other under this state, they are further subjected to a heat treatment at a temperature of 100° C. or higher for several tens minutes to several tens hours, whereby components constituting water are gradually removed from the interface. Accompanying this heat treatment, bonding processes proceed from bonding of hydroxyl groups which mainly consists of hydrogen bonds to bonding which relates to oxygen, hydrogen, and atoms constituting the substrates, and junction of atoms constituting the substrates gradually proceeds, with the result that the junction is extremely strengthened. When silicon or oxygen exists, particularly, covalent bonding proceeds to further enhance the bonding.

The temperature of the heat treatment is preferably set to be within a range of 200° to 1,000° C. and in which the characteristics of the piezoelectric materials are not lost.

Figure 2:
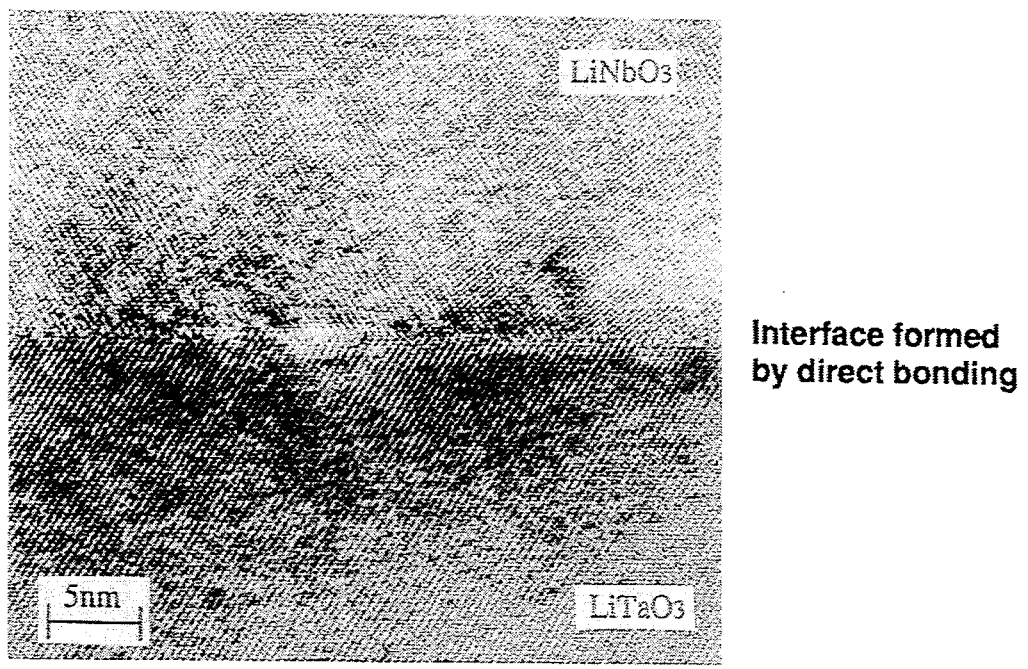
FIG. 2 shows a transmission electron microscope photograph of a direct bonding interface obtained by the invention.

FIG. 2 shows a transmission electron microscope (TEM) photograph of a direct bonding interface which was obtained by directly bonding lithium niobate with lithium tantalate in accordance with the above-mentioned method. The heat treatment was conducted at 400° C. for 1 hour. In the TEM image, lines appearing in the substrates are so-called lattice images of atoms. Since the intervals of the lines correspond to the lattice spaces, it is seen that the substrates are bonded in a precision of the order of a lattice or an atom (about 1 nm). In this manner, the junction can be attained with a high precision and without disposing an inclusion in the interface. Therefore, the loss in the propagation of a surface acoustic wave is very small.

In the case where such substrates are bonded by a conventional adhesive, it is difficult to reduce the thickness of the adhesive to several micrometers or less, so that a surface acoustic wave is highly attenuated. Accordingly, the resulting surface acoustic wave device cannot be practically used.

In the case where a piezoelectric material is formed by a thin-film technique such as the sputtering method, the chemical vapor deposition method, or the vacuum deposition method, it is possible to obtain a fairly good junction interface, but the resulting piezoelectric characteristics are very inferior to those of a bulk one. Furthermore, the kinds of piezoelectric materials which can be obtained by such a method are restricted to ZnO, AlN, etc. The crystal orientation of the product is restricted by the crystal orientation of the substrate, and the direction of easy growth is limited to the specific directions such as the C-axis direction.

When the direct bonding technique of the example is employed, a composite piezoelectric substrate with an arbitrary crystal orientation can be obtained by using lithium niobate, lithium tantalate, lithium borate, or quartz which is a single crystal piezoelectric material, while still retaining bulk properties.

Moreover, before or after direct bonding, one of the piezoelectric materials can be easily thinned by conducting an adequate process such as a polishing process. Usually, after direct bonding, one of the piezoelectric materials is thinned by a polishing process or the like to a thickness which is suitable for the surface acoustic wave to be used, and interdigital transducers are then formed. In the case where the thickness is within a handleable range, the piezoelectric material may be previously set so as to have the required thickness, and then the direct bonding may be conducted. In the case where the thickness is not within a handleable range or is usually less than about 50 $\mu$m, it is preferable to conduct direct bonding and then polish the piezoelectric material to thin it.

When the direct bonding of this example is used, the interface is obtained by a junction having a flatness in the order of an atom, thereby enabling a thinning process to be uniformly conducted in a highly accurate manner. Specifically, a thinning process of about 3 $\mu$m±0.01 $\mu$m can be attained. This is another advantage of the direct bonding.

In the configuration of FIGS. 1(a) and 1(b), surface acoustic wave devices composed of a wide variety of composite single crystal piezoelectric substrates and having a high flexibility of design can be obtained by adequately combining the piezoelectric characteristics, the sound velocities, the temperature dependences, and the thermal expansion coefficients of the single crystal piezoelectric substrate 10 and the single crystal piezoelectric thin plate 20.

The properties of a surface acoustic wave device depend mainly on the electromechanical coupling factor, the sound velocity, and the temperature dependence of the sound velocity. When a surface acoustic wave device is used in a filter or the like, the electromechanical coupling factor affects the insertion loss, and the pass-band width. Generally, the greater the electromechanical coupling factor is, the less the insertion loss is and the wider the pass-band width is. Depending on the use, therefore, the pass-band is designed so as to be wide or narrow.

The sound velocity determines the electrode width of interdigital transducers. The electrode width and interval of interdigital transducers are usually set to be about ¼ of the wavelength. In use in a high-frequency region, a higher sound velocity is preferable because a fine patterning process such as the photolithography can easily be conducted in the production.

By contrast, in use in a low-frequency region, or use such as a signal-delay line, a lower sound velocity is preferable because the size of the device can be reduced.

Generally, a smaller temperature dependence is preferable.

EXAMPLE 1-1

Figure 3:
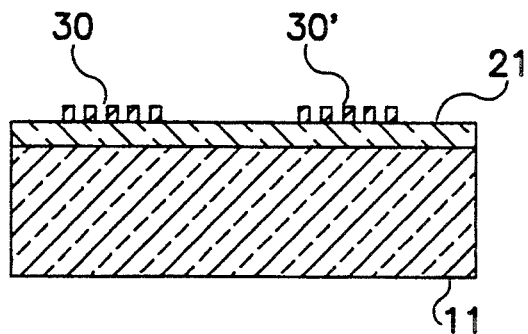
FIG. 3 shows a cross-sectional view for illustrating the configuration of a first specific example of Example 1.

FIG. 3 shows a cross-section for illustrating the configuration of a first specific example of Example 1. In the first specific example, lithium tantalate is used as the single crystal piezoelectric substrate, and lithium niobate as the single crystal piezoelectric thin plate.

Referring to FIG. 3, a surface acoustic wave device according to the first specific example includes a single crystal piezoelectric substrate 11 made of single crystal lithium tantalate of 36-degree Y-cut and X-propagation, and a single crystal piezoelectric thin plate 21 made of single crystal lithium niobate of 41-degree Y-cut and X-propagation. The single crystal piezoelectric substrate 11 and the single crystal piezoelectric thin plate 21 are formed into a composite structure by the above-described direct bonding.

The surface acoustic wave device further includes interdigital transducers 30 and 30' disposed on the single crystal piezoelectric thin plate 21. In FIG. 3, the interdigital transducers 30 and 30' are shown in a simplified manner.

The lithium niobate of 41-degree Y-cut and X-propagation has an electromechanical coupling factor of 17.2%, and a sound velocity of 4,792 m/sec., and the lithium tantalate of 36-degree Y-cut and X-propagation has an electromechanical coupling factor of 5 to 7%, and a sound velocity of 4,160 m/sec.

In the composite single crystal piezoelectric substrate, the thickness of the single crystal piezoelectric thin plate 21 can be set to be an adequate value in accordance with the wavelength of the surface acoustic wave to be used, thereby obtaining characteristics in which the substantial electromechanical coupling factor and sound velocity are different from those of the piezoelectric materials.

When the interdigital transducers are excited at about 200 MHz, for example, the intervals of the interdigital transducers are set to be ¼ of the wavelength, i.e., about 5 μm (it is assumed that the sound velocity is 4,160 m/sec.), and the thickness of the single crystal piezoelectric thin plate 21 is set to be ¼ of to 3 times the wavelength, i.e., 5 to 60 μm. In this configuration, both the electromechanical coupling factor and the sound velocity are obtained as values different from those obtained in the lithium niobate of 41-degree Y-cut and X-propagation used as the single crystal piezoelectric thin plate 21, and also those obtained in the lithium tantalate of 36-degree Y-cut and X-propagation used as the single crystal piezoelectric substrate 11.

Specifically, for example, the factor and the speed are obtained as intermediate values. When the thickness of the single crystal piezoelectric thin plate 21 is set to be about ½ of to 1 time the wavelength, an electromechanical coupling factor of 10% and a sound velocity of about 4,500 m/sec. are obtained. In this case, both the electromechanical coupling factor and the sound velocity are obtained as intermediate values of those of the piezoelectric materials, thereby realizing a surface acoustic wave device which is suitable for, for example, a filter having a narrow band in a high-frequency region.

As will be explained, the effect of the composite structure is remarkable particularly when the thickness of the single crystal piezoelectric thin plate 21 is set to be ¼ of to 1 time the wavelength. Also in the case where the thickness of the single crystal piezoelectric thin plate 21 is set to be 3 times the wavelength, the effect can be observed. The example can attain effects mainly on the electromechanical coupling factor and the sound velocity.

EXAMPLE 1-2

Figure 4:
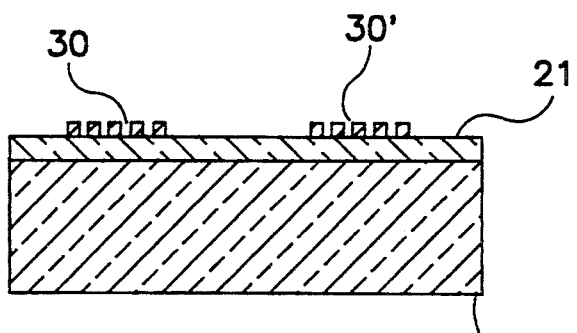
FIG. 4 shows a cross-sectional view for illustrating the configuration of a second specific example of Example 1.

FIG. 4 shows a cross-section for illustrating the configuration of a second specific example of Example 1. In the second specific example, quartz is used as the single crystal piezoelectric substrate, and lithium niobate as the single crystal piezoelectric thin plate.

Referring to FIG. 4, a surface acoustic wave device according to the second specific example includes a single crystal piezoelectric substrate 12 made of quartz of 43-degree Y-cut and X-propagation, and a single crystal piezoelectric thin plate 21 made of single crystal lithium niobate of 41-degree Y-cut and X-propagation. The single crystal piezoelectric substrate 12 and the single crystal piezoelectric thin plate 21 are formed into a composite structure by the above-described direct bonding.

The surface acoustic wave device further includes interdigital transducers 30 and 30' disposed on the single crystal piezoelectric thin plate 21. In FIG. 4, the interdigital transducers 30 and 30' are shown in a simplified manner.

The lithium niobate of 41-degree Y-cut and X-propagation has an electromechanical coupling factor of 17.2%, a sound velocity of 4,792 m/sec., and the temperature dependence of about 50 ppm/° C., and the quartz of 43-degree Y-cut and X-propagation has an electromechanical coupling factor of 0.16%, a sound velocity of 3,158 m/sec., and the temperature dependence of 0 ppm/° C.

As is explained in Example 1-1, the thickness of the single crystal piezoelectric thin plate 21 can also be set to be an adequate value in accordance with the wavelength of a surface acoustic wave to be used, thereby obtaining characteristics in which the substantial electromechanical coupling factor and sound velocity are different from those of the piezoelectric materials.

When the interdigital transducers are excited at about 200 MHz, for example, the intervals of the interdigital transducers are set to be ¼ of the wavelength, i.e., about 4 μm (it is assumed that the sound velocity is 3,158 m/sec.), and the thickness of the single crystal piezoelectric thin plate 21 is set to be ¼ of to 3 times the wavelength, i.e., 4 to 48 μm. In this configuration, both the electromechanical coupling factor and the sound velocity are obtained as values different from those obtained in the lithium niobate of 41-degree Y-cut and X-propagation used as the single crystal piezoelectric thin plate 21, and also those obtained in the quartz of 43-degree Y-cut and X-propagation used as the single crystal piezoelectric substrate 12.

Specifically, for example, the factor and the speed are obtained as intermediate values. When the thickness of the single crystal piezoelectric thin plate 21 is set to be about ½ of to 1 time the wavelength, an electromechanical coupling factor of 5%, a sound velocity of about 3,300 m/sec., and a temperature dependence of 30 ppm/° C. are obtained. In this case, the electromechanical coupling factor, the sound velocity, and the temperature dependence are obtained as intermediate values of those of the piezoelectric materials, thereby realizing a surface acoustic wave device which is suitable for, for example, a filter having a small temperature dependence.

The effect of the composite structure is remarkable particularly when the thickness of the single crystal piezoelectric thin plate 21 is set to be ¼ of to 1 time the wavelength. Also in the case where the thickness of the single crystal piezoelectric thin plate 21 is set to be 3 times the wavelength, the effect can be observed. The example can attain effects mainly on the temperature dependence.

EXAMPLE 1-3

Figure 5:
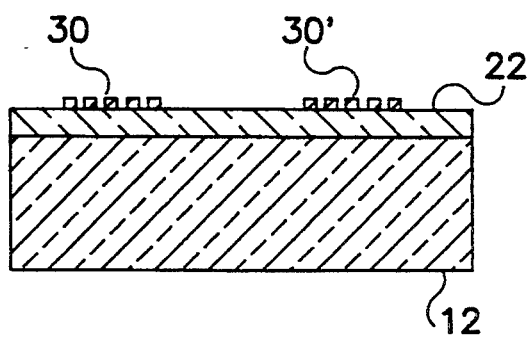
FIG. 5 shows a cross-sectional view for illustrating the configuration of a third specific example of Example 1.

FIG. 5 shows a cross-section for illustrating the configuration of a third specific example of Example 1. In the third specific example, quartz is used as the single crystal piezoelectric substrate, and lithium tantalate as the single crystal piezoelectric thin plate.

Referring to FIG. 5, a surface acoustic wave device according to the third specific example includes a single crystal piezoelectric substrate 12 made of quartz of 43-degree Y-cut and X-propagation, and a single crystal piezoelectric thin plate 22 made of single crystal lithium tantalate of 36-degree Y-cut and X-propagation. The single crystal piezoelectric substrate 12 and the single crystal piezoelectric thin plate 22 are formed into a composite structure by the above-described direct bonding.

The surface acoustic wave device further includes interdigital transducers 30 and 30' disposed on the single crystal piezoelectric thin plate 22. In FIG. 5, the interdigital transducers 30 and 30' are shown in a simplified manner.

The lithium tantalate of 36-degree Y-cut and X-propagation has an electromechanical coupling factor of 5 to 7%, a sound velocity of 4,160 m/sec., and the temperature dependence of about 30 ppm/° C., and the quartz of 43-degree Y-cut and X-propagation has an electromechanical coupling factor of 0.16%, a sound velocity of 3,158 m/sec., and a temperature dependence of 0 ppm/° C.

As is explained in Example 1-1, the thickness of the single crystal piezoelectric thin plate 22 can also be set to be an adequate value in accordance with the wavelength of a surface acoustic wave to be used, thereby obtaining characteristics in which the substantial electromechanical coupling factor and sound velocity are different from those of the piezoelectric materials.

When the interdigital transducers are excited at about 200 MHz, for example, the intervals of the interdigital transducers are set to be $\frac{1}{4}$ of the wavelength, i.e., about 4 μm (it is assumed that the sound velocity is 3,158 m/sec.), and the thickness of the single crystal piezoelectric thin plate 22 is set to be $\frac{1}{4}$ of to 3 times the wavelength, i.e., 4 to 48 μm. In this configuration, both the electromechanical coupling factor and the sound velocity are obtained as values different from those obtained in the lithium tantalate of 36-degree Y-cut and X-propagation used as the single crystal piezoelectric thin plate 22, and also those obtained in the quartz of 43-degree Y-cut and X-propagation used as the single crystal piezoelectric substrate 12.

Specifically, for example, the factor and the speed are obtained as intermediate values. When the thickness of the single crystal piezoelectric thin plate 22 is set to be about $\frac{1}{2}$ of to 1 time the wavelength, an electromechanical coupling factor of 2%, a sound velocity of about 3,300 m/sec., and a temperature dependence of 20 ppm/° C. are obtained. In this case, the electromechanical coupling factor, the sound velocity, and the temperature dependence are obtained as intermediate values of those of the piezoelectric materials, thereby realizing a surface acoustic wave device which is suitable for, for example, a filter having a small temperature dependence.

The effect of the composite structure is remarkable particularly when the thickness of the single crystal piezoelectric thin plate 22 is set to be $\frac{1}{4}$ of to 1 time the wavelength. Also in the case where the thickness of the single crystal piezoelectric thin plate 22 is set to be 3 times the wavelength, the effect can be observed. The example can attain effects mainly on the temperature dependence.

EXAMPLE 1-4

Figure 6:
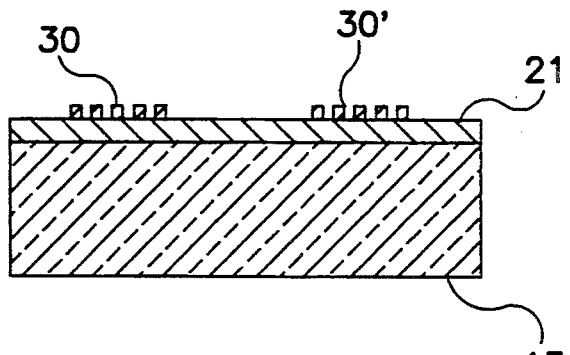
FIG. 6 shows a cross-sectional view for illustrating the configuration of a fourth specific example of Example 1.

FIG. 6 shows a cross-section for illustrating the configuration of a fourth specific example of Example 1. In the forth specific example, lithium borate is used as the single crystal piezoelectric substrate, and lithium niobate as the single crystal piezoelectric thin plate.

Referring to FIG. 6, a surface acoustic wave device according to the fourth specific example includes a single crystal piezoelectric substrate 13 made of lithium borate of 45-degree X-cut and Z-propagation, and a single crystal piezoelectric thin plate 21 made of single crystal lithium niobate of 41-degree Y-cut and X-propagation. The single crystal piezoelectric substrate 13 and the single crystal piezoelectric thin plate 21 are formed into a composite structure by the above-described direct bonding.

The surface acoustic wave device further includes interdigital transducers 30 and 30' disposed on the single crystal piezoelectric thin plate 21. In FIG. 6, the interdigital transducers 30 and 30' are shown in a simplified manner.

The lithium niobate of 41-degree Y-cut and X-propagation has an electromechanical coupling factor of 17.2%, a sound velocity of 4,792 m/sec., and a temperature dependence of about 50 ppm/° C., and the lithium borate of 45-degree X-cut and Z-propagation has an electromechanical coupling factor of 1%, a sound velocity of 3,401 m/sec., and the temperature dependence of 0 ppm/° C.

As is explained in Example 1-1, the thickness of the single crystal piezoelectric thin plate 21 can also be set to be an adequate value in accordance with the wavelength of a surface acoustic wave to be used, thereby obtaining characteristics in which the substantial electromechanical coupling factor and sound velocity are different from those of the piezoelectric materials.

When the interdigital transducers are excited at about 200 MHz, for example, the intervals of the interdigital transducers are set to be $\frac{1}{4}$ of the wavelength, i.e., about 4 μm (it is assumed that the sound velocity is 3,401 m/sec.), and the thickness of the single crystal piezoelectric thin plate 21 is set to be $\frac{1}{4}$ of to 3 times the wavelength, i.e., 4 to 48 μm. In this configuration, both the electromechanical coupling factor and the sound velocity are obtained as values different from those obtained in the lithium niobate of 41-degree Y-cut and X-propagation used as the single crystal piezoelectric thin plate 21, and also those obtained in the lithium borate of 45-degree X-cut and Z-propagation used as the single crystal piezoelectric substrate 13.

Specifically, for example, the factor and the speed are obtained as intermediate values. When the thickness of the single crystal piezoelectric thin plate 21 is set to be about $\frac{1}{2}$ of to 1 time the wavelength, an electromechanical coupling factor of 5%, a sound velocity of about 3,500 m/sec., and a temperature dependence of 30 ppm/° C. are obtained. In this case, the electromechanical coupling factor, the sound velocity, and the temperature dependence are obtained as intermediate values of those of the piezoelectric materials, thereby realizing a surface acoustic wave device which is suitable for, for example, a filter having a small temperature dependence.

The effect of the composite structure is remarkable particularly when the thickness of the single crystal piezoelectric thin plate 21 is set to be ¼ of to 1 time the wavelength. Also in the case where the thickness of the single crystal piezoelectric thin plate 21 is set to be 3 times the wavelength, the effect can be observed. The example can attain effects mainly on the temperature dependence.

In the above, specific combinations of lithium niobate, lithium tantalate, lithium borate, and quartz have been described as the single crystal piezoelectric materials. Also in other combinations, composite single crystal piezoelectric substrates having various electromechanical coupling factors, sound velocities, and temperature dependences in accordance with the combinations can be obtained.

EXAMPLE 2

Figure 7A:
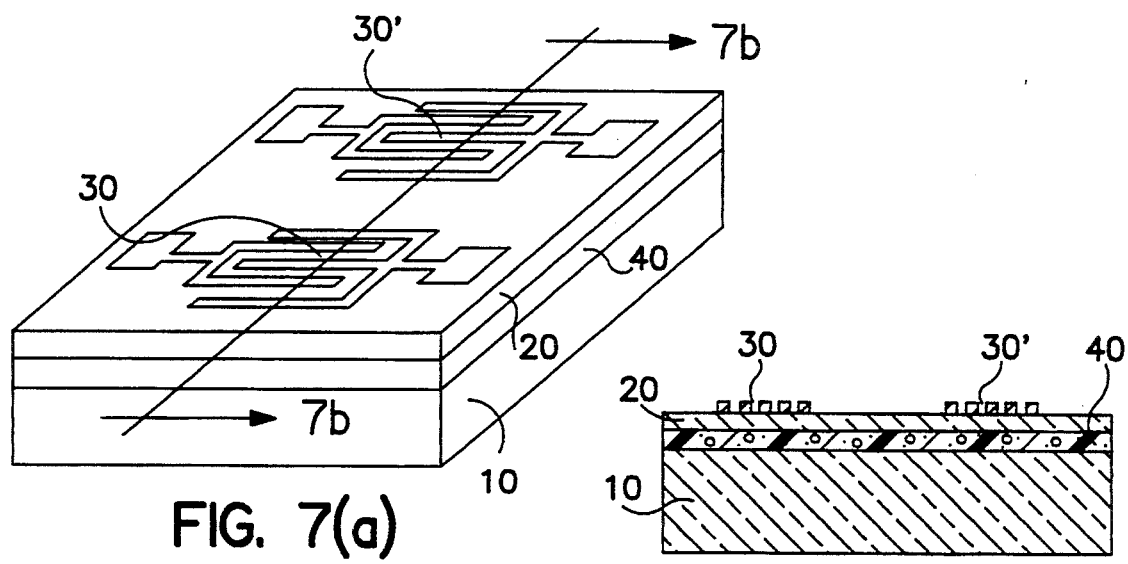
FIG. 7 (a) shows a perspective view for illustrating the configuration of the surface acoustic wave device according to Example 2 of the invention.
FIG. 7(b) shows a cross-sectional view taken along a line A-A' in FIG. 7(a).
Figure 7B:
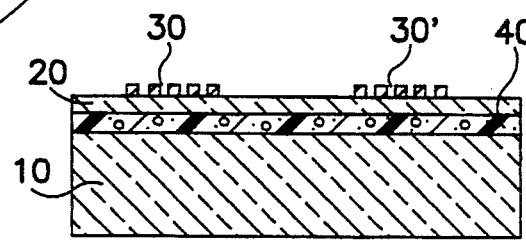

FIG. 7(a) is a perspective view of a second example of the configuration of the surface acoustic wave device of the invention, and FIG. 7(b) shows a section structure of the A-A' portion in FIG. 7(a).

Referring to FIGS. 7(a) and 7(b), the surface acoustic wave device of the invention includes a single crystal piezoelectric substrate 10, a single crystal piezoelectric thin plate 20, and interdigital transducers 30 and 30'. The surface acoustic wave device further includes an inorganic thin film layer 40 formed between the single crystal piezoelectric substrate 10 and the single crystal piezoelectric thin plate 20. The interdigital transducers 30 and 30' are disposed on the single crystal piezoelectric thin plate 20. In FIGS. 7(a) and 7(b), the interdigital transducers 30 and 30' are shown in a simplified manner for clarity, as the actual construction of the interdigital transducers 30 and 30' are well known.

Suitable materials for the single crystal piezoelectric substrate 10 and the single crystal piezoelectric thin plate 20 are lithium niobate, lithium tantalate, lithium borate, and quartz.

Suitable materials for the inorganic thin film layer 40 is silicon, silicon compounds such as silicon oxide and silicon nitride, and boron compounds such as borate compounds. The thickness of the inorganic thin film layer 40 is set to be sufficiently smaller than the wavelength of the surface acoustic wave to be used. Specifically, the thickness is preferably less than the wavelength or ½ of the wavelength of the surface acoustic wave to be used.

As is explained in Example 1, the device functions as a surface acoustic wave device in the following way. A high frequency signal is applied to the interdigital transducer 30 so that a surface acoustic wave is excited in the piezoelectric portion in the vicinity of the interdigital transducer 30. The surface acoustic wave propagates to the other interdigital transducer 30' through the lamination structure, and is then inverted into an electric signal in the piezoelectric portion under the interdigital transducer 30'. In this description, a fundamental configuration of a surface acoustic wave device using interdigital transducers is illustrated. When such a device is actually used in a high frequency filter or a resonator, the number of the interdigital transducers is increased and the configuration is modified.

The lamination structure of the single crystal piezoelectric substrate 10 and the single crystal piezoelectric thin plate 20 is obtained in the following way. Two single crystal piezoelectric substrates at least one of which has the inorganic thin film layer 40 thereon are prepared, and the surfaces of the substrates are subjected to flattening, mirror-polishing, cleaning, and hydrophilic processes. The two substrates are then bonded by direct bonding with each other by stacking them and conducting a heat treatment, so as to form the lamination. Thereafter, the single crystal piezoelectric thin plate 20 is polished and thinned to a predetermined thickness. The direct bonding has explained in Example 1.

After forming a lamination structure consisting of the single crystal piezoelectric substrate 10, the single crystal piezoelectric thin plate 20, and the inorganic thin film layer 40, the interdigital transducers 30 and 30' are formed on the single crystal piezoelectric thin plate 20 by a lithographic technique. The interdigital transducers 30 and 30' are made of aluminum, gold, or the like.

Hereinafter, a production process for the direct bonding will be described. A specific example will be described in which single crystal lithium niobate, lithium tantalate, lithium borate, or quartz is used as a material of the single crystal piezoelectric substrate and in which silicon, silicon oxide, silicon nitride, and boro-silicate glass is used as a material of the inorganic thin film layer 40.

The surfaces of two single crystal piezoelectric substrates which are to-be directly bonded are flattened, mirror-polished, and cleaned. As required, the surface layers are etched away.

Then, the inorganic thin film layer 40 is formed on the surface portion of one of the two single crystal piezoelectric substrates by a thin-film technique. The surface portion will be a junction face of direct bonding. The inorganic thin film layer 40 can be formed from each material mentioned above by a sputtering method, a CVD method, or a vacuum evaporation method. The thickness of the inorganic thin film layer 40 is set so as to be sufficiently larger than the wavelength of the surface acoustic wave that will be used. Specifically, the thickness is preferably less than ½ of the wavelength of the surface acoustic wave to be used, more preferably less than 1/10 of the wavelength, for example, 0.1 to 1 μm.

Then, the surfaces of the inorganic thin film layer and the single crystal piezoelectric substrates are flattened, mirror-polished, and cleaned. In the case where the inorganic thin film layer 40 formed on the single crystal piezoelectric substrate is sufficiently flat and clean, this process step is not necessary. This is because the single crystal piezoelectric substrate is flatted, mirror-polished, and cleaned before the formation of the inorganic thin film layer. The following process steps are the same as those explained in Example 1.

Specifically, the materials are soaked in an ammonia-hydrogen peroxide solution to cause a hydroxyl group to easily be attached to the surfaces or make the surfaces hydrophilic. Thereafter, the surfaces cleaned are sufficiently by pure water, resulting in hydroxyl groups be attached to the surfaces of the single crystal piezoelectric substrates. The two single crystal piezoelectric substrates are stacked together under this state, so that the two substrates stick to each other mainly by van der Waals forces. Although the substrates are strongly bonded to each other under this state, they are further subjected to a heat treatment at a temperature of 100° C. or higher for several tens minutes to several tens hours, whereby components constituting water are gradually removed from the interface. Accompanying this heat treatment, bonding processes proceed from bonding of hydroxyl groups which mainly consists of hydrogen bonds to bonding which relates to oxygen, hydrogen, and atoms constituting the substrates, and junction of atoms constituting the substrates gradually proceeds, with the result that the junction is extremely strengthened. Particularly, as the inorganic thin film layer contains silicon, covalent bonding proceeds to further enhance the bonding.

The temperature of the heat treatment is preferably set to be within a range of 200° to 1,000° C. and in which case the characteristics of the piezoelectric materials are not lost.

In this manner, the junction can be attained with a high precision and without disposing an inclusion in the interface. Therefore, the loss in the propagation of a surface acoustic wave is very small. In the case where the thickness of the inorganic thin film layer is sufficiently smaller than the wavelength of the surface acoustic wave to be used, the loss in the propagation of the surface acoustic wave is very small at the inorganic thin film layer, which brings no problems in practical use. Therefore, the surface acoustic wave device of this example has the same advantages as those of the device of Example 1.

The example is characterized in that the direct bonding interface is provided with an inorganic thin film layer unlike Example 1. This configuration can produce two advantages as follows.

The first advantage is that, even when there is a little amount of dust during the bonding, the dust is introduced into the inorganic thin film layer during a process of direct bonding and therefore the production yield of the bonding process is improved.

The second advantage is that interdigital transducers can easily be embedded in the inorganic thin film layer and therefore the flexibility of design as a surface acoustic wave device is further enhanced.

FIGS. 8(a) through 8(e) show an example having a configuration in which interdigital transducers are embedded in the inorganic thin film layer.

Figure 8A:
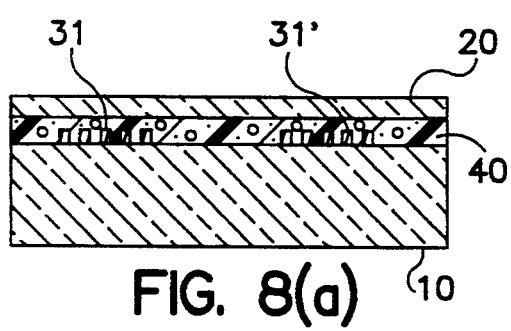
FIGS. 8(a) through 8(e) show cross-sectional views for illustrating specific configurations of inter digital transducers in the surface acoustic wave device according to Example 2.

In FIG. 8(a), an inorganic thin film layer 40 is formed between a single crystal piezoelectric substrate 10 and a single crystal piezoelectric thin plate 20. Interdigital transducers 31 and 31' are formed on the single crystal piezoelectric substrate 10 and embedded in the inorganic thin film layer 40. Although not shown, the ends of the interdigital transducers 31 and 31' are exposed so as to be connected to an external circuit.

Figure 8B:
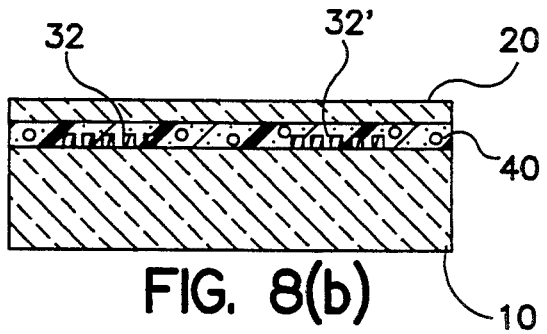

FIG. 8(b) shows an example in which interdigital transducers 32 and 32' are formed on the side of the single crystal piezoelectric thin plate 20, the side being in contact with the inorganic thin film layer 40.

Figure 8C:
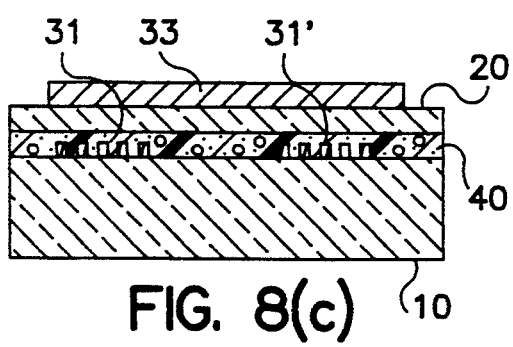

FIG. 8(c) shows an example in which an earth electrode 33 is disposed on the upper face of the single crystal piezoelectric thin plate 20 in the configuration of FIG. 8(a).

Figure 8D:
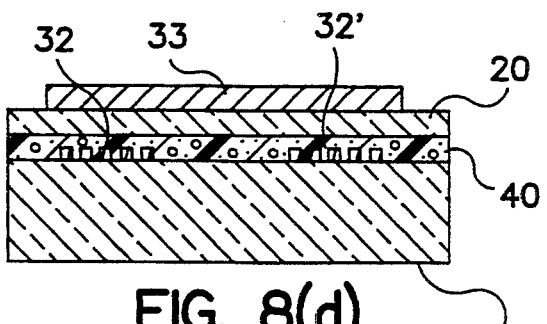

FIG. 8(d) shows an example in which the earth electrode 33 is disposed on the upper face of the single crystal piezoelectric thin plate 20 in the configuration of FIG. 8(b).

Figure 8E:
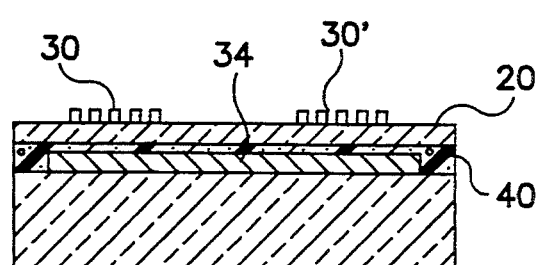

FIG. 8(e) shows an example in which an earth electrode 34 is formed on the single crystal piezoelectric substrate 10 being embedded in the inorganic thin film layer 20 in the configuration of FIGS. 7(a) and 7(b).

Differences of properties depending on the differences in electrode configuration will be qualitatively described below. Basically, the properties are dependent on the portion of the upper and lower substrates at which the electric field concentrates. In these configurations, easy concentration of the electric field into the single crystal piezoelectric thin plate occurs in the order of FIG. 8(e), FIGS. 7(a) and 7(b), FIGS. 8(d) and 8(c), and FIGS. 8(b) and 8(a). Qualitatively, piezoelectric characteristics which are mixtures of the characteristics of the respective pair of upper and lower substrates and can be arranged substantially in this order are obtained as those of the laminated structures.

In the case of such an electrode configuration, therefore, a surface acoustic wave is excited in a different manner even when the kinds and thicknesses of the piezoelectric materials are the same as those of FIGS. 7(a) and 7(b), with the result that the obtained piezoelectric characteristics are naturally different from those of FIGS. 7(a) and 7(b). Specifically, for example, an effect that the electromechanical coupling factor is large can be attained.

The configuration of FIGS. 8(a) to 8(e) can be obtained by subjecting the surface of the single crystal piezoelectric substrate to flattening, mirror-polishing, cleaning, and cleaning processes, then forming the interdigital transducers, forming on the electrodes the inorganic thin film layer by one of various thin film forming techniques in the manner described above, and conducting the direct bonding in the above-mentioned production process. When the interdigital transducers are to be embedded, the inorganic thin film layer must have a sufficiently high resistance.

Also in the configuration of FIGS. 7(a) and 7(b) or FIGS. 8(a) to 8(e), surface acoustic wave devices composed of a wide variety of composite single crystal piezoelectric substrates and having a high flexibility of design can be obtained by adequately combining the piezoelectric characteristics, the sound velocities, the temperature dependences, and the thermal expansion coefficients of the single crystal piezoelectric substrate 10 and the single crystal piezoelectric thin plate 20.

EXAMPLE 2-1

Figure 9:
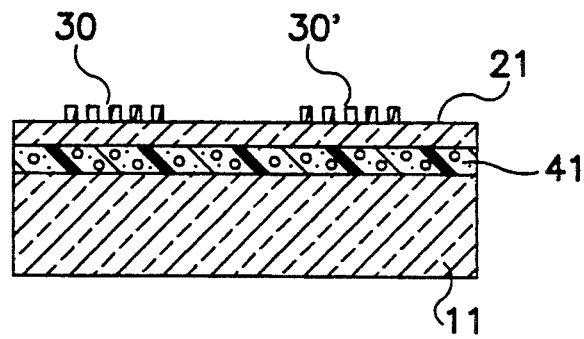
FIG. 9 shows a cross-sectional view for illustrating the configuration of a first specific example of Example 2.

FIG. 9 shows the configuration of a first specific example of Example 2. In the example, lithium tantalate is used as a material of the single crystal piezoelectric substrate 11, lithium niobate as a material of the single crystal piezoelectric thin plate 21, and silicon as a material of the inorganic thin film layer 41.

In FIG. 9, the inorganic thin film layer 41 is formed between the single crystal piezoelectric substrate 11 and the single crystal piezoelectric thin plate 21. The single crystal piezoelectric substrate 11 is made of single crystal lithium tantalate of 36-degree Y-cut and X-propagation, and a single crystal piezoelectric thin plate 21 is made of single crystal lithium niobate of 41-degree Y-cut and X-propagation. The inorganic thin film layer 41 is made of amorphous silicon or polisilicon and formed on the single crystal piezoelectric substrate 11 by a sputtering method, a chemical vapor deposition method, or a vacuum deposition method.

The single crystal piezoelectric thin plate 21 is made composite at the interface between the single crystal piezoelectric thin plate 21 and the inorganic thin film layer 41 by the above-described direct bonding. The interdigital transducers 30 and 30' are disposed on the single crystal piezoelectric thin plate 21 in the same manner as Example 1-1. In FIG. 9, the interdigital transducers 30 and 30' are shown in a simplified manner.

Also in the example, when the thickness of the inorganic thin film layer 41 is sufficiently reduced (⅛ of the wavelength or less, more preferably 1/10 of the wavelength or less), an effect which is substantially the same as that of Example 1-1 can be attained on the flexibility of design of the piezoelectric characteristics.

In the example, the existence of the inorganic thin film layer 41 allows the production process to be advantageously conducted as described above and increases the flexibility of the arrangement of the interdigital transducers 30 and 30'.

EXAMPLE 2-2

Figure 10:
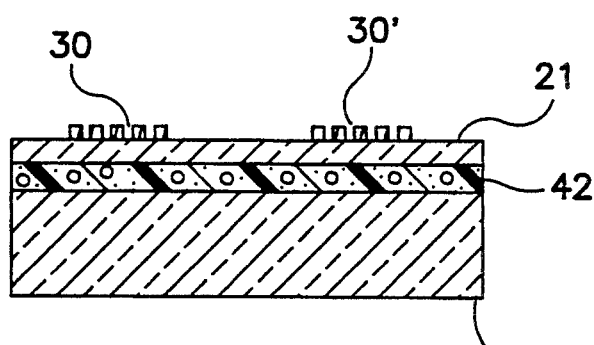
FIG. 10 shows a cross-sectional view for illustrating the configuration of a second specific example of Example 2.

FIG. 10 shows the configuration of a second specific example of Example 2. In the example, quartz is used as a material of the single crystal piezoelectric substrate 12, lithium niobate as a material of the single crystal piezoelectric thin plate 21, and silicon oxide or silicon nitride as a material of the inorganic thin film layer 42.

In FIG. 10, the inorganic thin film layer 42 is formed between the single crystal piezoelectric substrate 12 and the single crystal piezoelectric thin plate 21. The single crystal piezoelectric substrate 12 is made of quartz of 43-degree Y-cut and X-propagation, and a single crystal piezoelectric thin plate 21 is made of single crystal lithium niobate of 41-degree Y-cut and X-propagation. The inorganic thin film layer 42 is made of silicon oxide (amorphism) or silicon nitride (amorphism) and formed on the single crystal piezoelectric substrate 12 by a sputtering method, a chemical vapor deposition method, or a vacuum deposition method.

The single crystal piezoelectric thin plate 21 is made composite at the interface between the single crystal piezoelectric thin plate 21 and the inorganic thin film layer 42 by the above-described direct bonding. The interdigital transducers 30 and 30' are disposed on the single crystal piezoelectric thin plate 21 in the same manner as Example 2-1. In FIG. 10, the interdigital transducers 30 and 30' are shown in a simplified manner.

Also in the example, when the thickness of the inorganic thin film layer 42 is sufficiently reduced ($\frac{1}{2}$ of the wavelength or less, more preferably 1/10 of the wavelength or less), an effect which is the substantially same as that of Example 1-2 can be attained on the flexibility of design of the piezoelectric characteristics.

In the example, the existence of the inorganic thin film layer 42 allows the production process to be advantageously conducted as described above and increases the flexibility of the arrangement of the interdigital transducers 30 and 30'.

EXAMPLE 2-3

Figure 11:
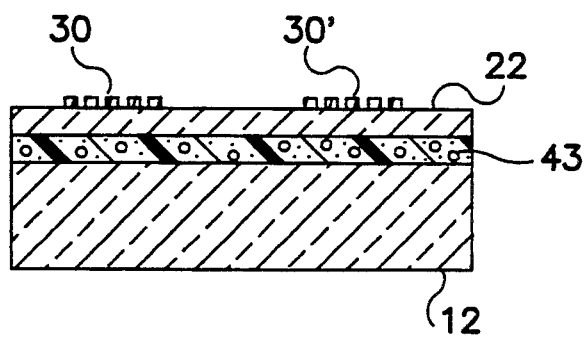
FIG. 11 shows a cross-sectional view for illustrating the configuration of a third specific example of Example 2.

FIG. 11 shows the configuration of a third specific example of Example 2. In the example, quartz is used as a material of the single crystal piezoelectric substrate 12, lithium tantalate as a material of the single crystal piezoelectric thin plate 22, and boro-silicate glass as a material of the inorganic thin film layer 43.

In FIG. 11, the inorganic thin film layer 43 is formed between the single crystal piezoelectric substrate 12 and the single crystal piezoelectric thin plate 22. The single crystal piezoelectric substrate 12 is made of quartz of 43-degree Y-cut and X-propagation, and a single crystal piezoelectric thin plate 22 is made of single crystal lithium tantalate of 36-degree Y-cut and X-propagation. The inorganic thin film layer 43 is made of boro-silicate glass and formed on the single crystal piezoelectric substrate 12 by a sputtering method, a chemical vapor deposition method, or a vacuum deposition method.

The single crystal piezoelectric thin plate 22 is made composite at the interface between the single crystal piezoelectric thin plate 22 and the inorganic thin film layer 43 by the above-described direct bonding. The interdigital transducers 30 and 30' are disposed on the single crystal piezoelectric thin plate 22 in the same manner as Example 2-1. In FIG. 11, the interdigital transducers 30 and 30' are shown in a simplified manner.

Also in the example, when the thickness of the inorganic thin film layer 43 is sufficiently reduced ($\frac{1}{2}$ of the wavelength or less, more preferably 1/10 of the wavelength or less), an effect which is substantially the same as that of Example 1-3 can be attained on the flexibility of design of the piezoelectric characteristics.

In the example, the existence of the inorganic thin film layer 43 allows the production process to be advantageously conducted as described above and increases the flexibility of the arrangement of the interdigital transducers 30 and 30'.

EXAMPLE 2-4

Figure 12:
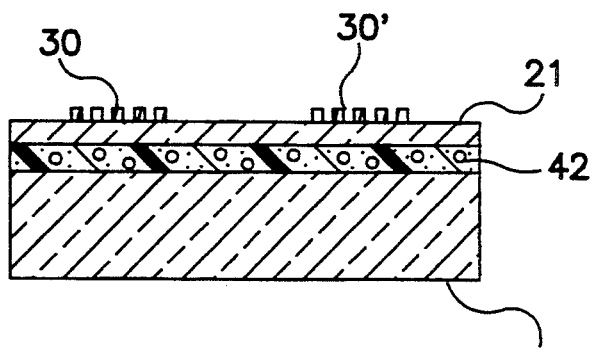
FIG. 12 shows a cross-sectional view for illustrating the configuration of a fourth specific example of Example 2.

FIG. 12 shows the configuration of a fourth specific example of Example 2. In the example, lithium borate is used as a material of the single crystal piezoelectric substrate 13, lithium niobate as a material of the single crystal piezoelectric thin plate 21, and silicon oxide or silicon nitride as a material of the inorganic thin film layer 42.

In FIG. 12, the inorganic thin film layer 42 is formed between the single crystal piezoelectric substrate 13 and the single crystal piezoelectric thin plate 21. The single crystal piezoelectric substrate 13 is made of single crystal lithium borate of 45-degree X-cut and Z-propagation, and a single crystal piezoelectric thin plate 21 is made of single crystal lithium niobate of 41-degree Y-cut and X-propagation. The inorganic thin film layer 42 is made of silicon oxide or silicon nitride and formed on the single crystal piezoelectric substrate 13 by a sputtering method, a chemical vapor deposition method, or a vacuum deposition method.

The single crystal piezoelectric thin plate 21 is made composite at the interface between the single crystal piezoelectric thin plate 21 and the inorganic thin film layer 42 by the above-described direct bonding. The interdigital transducers 30 and 30' are disposed on the single crystal piezoelectric thin plate 21 in the same manner as Example 2-1. In FIG. 12, the interdigital transducers 30 and 30' are shown in a simplified manner.

Also in the example, when the thickness of the inorganic thin film layer 42 is sufficiently reduced ($\frac{1}{2}$ of the wavelength or less, more preferably 1/10 of the wavelength or less), an effect which is substantially the same as that of Example 1-4 can be attained on the flexibility of design of the piezoelectric characteristics.

In the example, the existence of the inorganic thin film layer 42 allows the production process to be advantageously conducted as described above and increases the flexibility of the arrangement of the interdigital transducers 30 and 30'.

In the above, specific combinations of lithium niobate, lithium tantalate, lithium borate, and quartz have been described as the single crystal piezoelectric materials, and silicon, silicon oxide, silicon nitride, and boro-silicate glass as the inorganic thin film layer have been described. Also in other combinations, composite single crystal piezoelectric substrates having various electromechanical coupling factors, sound velocities, and temperature dependences in accordance with the combinations can be obtained.

EXAMPLE 3

Figure 13A:
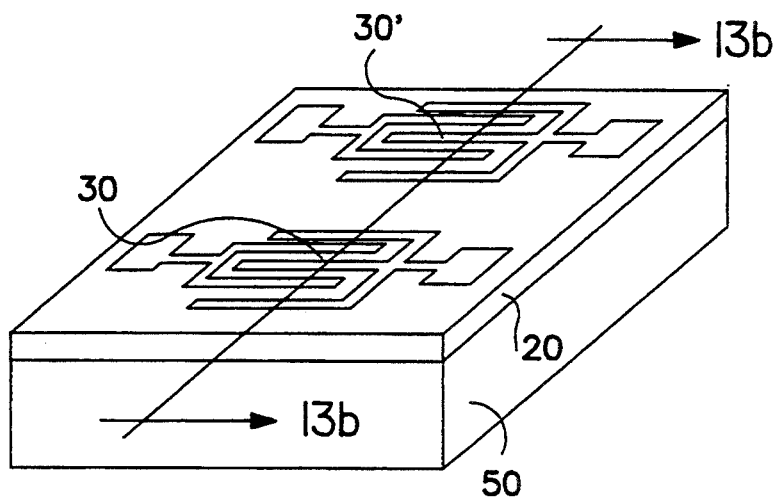
FIG. 13(a) shows a perspective view for illustrating the configuration of the surface acoustic wave device according to Example 3 of the invention.
Figure 13B:
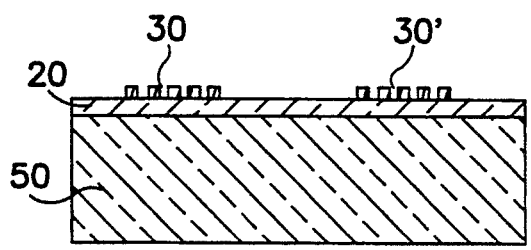
FIG. 13(b) shows a cross-sectional view taken along a line A-A' in FIG. 13(a).

FIG. 13(a) is a perspective view of a third example of the configuration of the surface acoustic wave device of the invention, and FIG. 13(b) shows a section structure of the A–A' portion in FIG. 13(a).

Referring to FIGS. 13(a) and 13(b), the surface acoustic wave device of the invention includes non-piezoelectric 50, a single crystal piezoelectric thin plate 20 formed on a non-piezoelectric substrate 50, and interdigital transducers 30 and 30' formed on the single crystal piezoelectric thin plate 20. In FIGS. 13(a) and 13(b), the interdigital transducers 30 and 30' are shown in a simplified manner for clarity, as the actual construction of the interdigital transducers 30 and 30' are well known.

The non-piezoelectric substrate 50 may be an non-piezoelectric or a conductive substrate. Suitable substrates for the non-piezoelectric substrate 50 are a substrate having a low sound velocity such as a glass substrate, a substrate having low thermal expansion coefficient, and a substrate having high sound velocity such as a boron substrate, amorphous carbon substrate, or a graphite substrate.

Suitable materials for the single crystal piezoelectric thin plate 20 are lithium niobate, lithium tantalate, lithium borate, and quartz.

As is explained in Example 1, the device functions as a surface acoustic wave device in the following way. A high frequency signal is applied to the interdigital transducer 30 so that a surface acoustic wave is excited in the piezoelectric portion in the vicinity of the interdigital transducer 30. The surface acoustic wave propagates to the other interdigital transducer 30' through the lamination structure, and is then inverted into an electric signal in the piezoelectric portion under the interdigital transducer 30'. In this description, a fundamental configuration of a surface acoustic wave device using interdigital transducers is illustrated. When such a device is actually used in a high frequency filter or a resonator, the number of the interdigital transducers is increased and the configuration is modified.

The lamination structure of the non-piezoelectric substrate 50 and the single crystal piezoelectric thin plate 20 is obtained in the following way. The surfaces of the non-piezoelectric substrate 50 and the single crystal piezoelectric thin plate 20 are subjected to flattening, mirror-polishing, cleaning, and hydrophilic processes, and are then bonded by direct bonding with each other by stacking them and conducting a heat treatment, so as to form a lamination. Thereafter, the single crystal piezoelectric thin plate 20 is polished and thinned to a predetermined thickness.

After forming a lamination structure consisting of the non-piezoelectric substrate 50 and the single crystal piezoelectric thin plate 20, the interdigital transducers 30 and 30' are formed on the single crystal piezoelectric thin plate 20 by a lithographic technique. The interdigital transducers 30 and 30' are made of aluminum, gold, or the like.

Hereinafter, a production process for the direct bonding will be described. A specific example will be described in which single crystal lithium niobate, lithium tantalate, lithium borate, or quartz is used as a material of the single crystal piezoelectric thin plate 20 and in which glass, boron, amorphous carbon, or graphite is used as a material of the non-piezoelectric substrate 50.

The surfaces of the non-piezoelectric substrate 50 and a single crystal piezoelectric substrates for the plate 20 which are to be directly bonded are flattened, mirror-polished, and cleaned. As required, the surface layers are etched away. When lithium niobate, lithium tantalate, or quartz is to be etched, a hydrofluoric etchant is used. When lithium borate is to be etched, a weak acid is used. The surface of the non-piezoelectric substrate 50 is also subjected to the etching with a hydrofluoric etchant. Then, the surfaces are subjected to a process of making them hydrophilic. Specifically, the materials are soaked in an ammonia-hydrogen peroxide solution to cause a hydroxyl group to easily be attached to the surfaces or make the surfaces hydrophilic. Thereafter, the surfaces are cleaned sufficiently by pure water, resulting in hydroxyl groups be attached to the surfaces of the single crystal piezoelectric substrates. The two single crystal piezoelectric substrates are stacked together under this state, so that the two substrates are caused to stick to each other mainly by van der Waals forces. Although the substrates are strongly bonded to each other under this state, they are further subjected under this state to a heat treatment at a temperature of 100° C. or higher for several tens minutes to several tens hours, whereby components constituting water are gradually removed from the interface. Accompanying this heat treatment, bonding processes proceed from bonding of hydroxyl groups which mainly consists of hydrogen bonds to bonding which relates to oxygen, hydrogen, and atoms constituting the substrates, and junction of atoms constituting the substrates gradually proceeds, with the result that the junction is extremely strengthened. When silicon or oxygen exists, particularly, covalent bonding proceeds to further enhance the bonding.

The temperature of the heat treatment is preferably set to be within a range of 200° to 1,000° C. and in which the characteristics of the piezoelectric materials are not lost.

In this manner, the junction can be attained with a high precision and without disposing an inclusion in the interface. Therefore, the loss in the propagation of a surface acoustic wave is very small.

The non-piezoelectric 50 may be a substrate having an insulating film formed of boron, amorphous carbon, or graphite by a thin film formation technique. In this case, the thickness of the insulating film is preferably larger than the surface acoustic wave to be used.

In the configuration of FIGS. 13(a) and 13(b), surface acoustic wave devices composed of a wide variety of composite single crystal piezoelectric substrates and having a high flexibility of design can be obtained by adequately combining a sound velocity and a thermal expansion coefficient of the non-piezoelectric substrate 50, and the piezoelectric characteristics, the sound velocities, the temperature dependences, and the thermal expansion coefficients of the single crystal piezoelectric thin plate 20.

EXAMPLE 3-1

Figure 14:
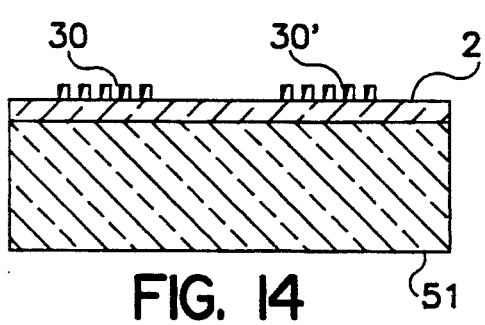
FIG. 14 shows a cross-sectional view for illustrating the configuration of a first specific example of Example 3.

FIG. 14 shows a cross-section for illustrating the configuration of a first specific example of Example 3. In the first specific example, glass having a low sound velocity is used as the non-piezoelectric substrate, and lithium niobate as the single crystal piezoelectric thin plate.

Referring to FIG. 14, a surface acoustic wave device according to the first specific example includes a non-piezoelectric substrate 51 made of boro-silicate glass, and a single crystal piezoelectric thin plate 21 made of single crystal lithium niobate of 41-degree Y-cut and X-propagation. The non-piezoelectric 51 and the single crystal piezoelectric thin plate 21 are formed into a composite structure by the above-described direct bonding.

The surface acoustic wave device further includes interdigital transducers 30 and 30' disposed on the single crystal piezoelectric thin plate 21. In FIG. 14, the interdigital transducers 30 and 30' are shown in a simplified manner.

The lithium niobate of 41-degree Y-cut and X-propagation has an electromechanical coupling factor of 17.2%, and a sound velocity of 4,792 m/sec.

In the composite single crystal piezoelectric substrate which is made composite by the direct bonding, the thickness of the single crystal piezoelectric thin plate 21 can be set to be an adequate value in accordance with the wavelength of a surface acoustic wave to be used, thereby obtaining characteristics in which the substantial electromechanical coupling factor and sound velocity are different from those of the piezoelectric materials.

When the interdigital transducers are excited at about 200 MHz, for example, the intervals of the interdigital transducers are set to be ¼ of the wavelength, i.e., about 2.5 μm (it is assumed that the sound velocity is 2,000 m/sec.), and the thickness of the single crystal piezoelectric thin plate 21 is set to be ¼ of to 1 times the wavelength, i.e., 2.5 to 10 μm. In this configuration, both the electromechanical coupling factor and the sound velocity are obtained as values different from those obtained in the lithium niobate of 41-degree Y-cut and X-propagation used as the single crystal piezoelectric thin plate 21, and also those obtained in the boro-silicate glass used as the non-piezoelectric substrate 51.

Specifically, for example, the factor and the speed are obtained as intermediate values. When the thickness of the single crystal piezoelectric thin plate 21 is set to be about ½ of to 1 time the wavelength, an electromechanical coupling factor of 1 to 5% and a sound velocity of 1,500 to 2,500 m/sec. are obtained. In this case, both the electromechanical coupling factor and the sound velocity are obtained as intermediate values of those of the piezoelectric material and the insulating material. As the electromechanical coupling factor is relatively large and the sound velocity is relatively low, thereby realizing a surface acoustic wave device which is suitable for, for example, a filter or a delay line used for low frequency.

The effect of the composite structure is remarkable particularly when the thickness of the single crystal piezoelectric thin plate 21 is set to be ½ of to 1 time the wavelength. The example can attain effects mainly on the electromechanical coupling factor and the sound velocity.

EXAMPLE 3-2

Figure 15:
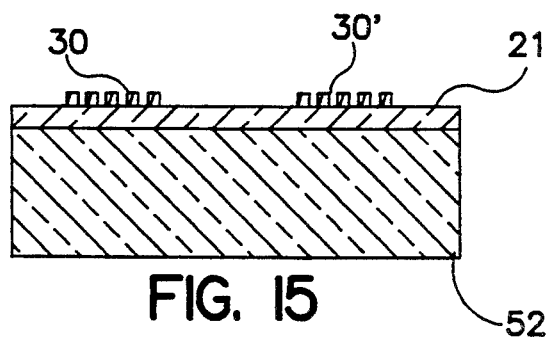
FIG. 15 shows a cross-sectional view for illustrating the configuration of a second specific example of Example 3.

FIG. 15 shows a cross-section for illustrating the configuration of a second specific example of Example 3. In the second specific example, boron, amorphous carbon, or graphite having a high sound velocity is used as the non-piezoelectric substrate, and lithium niobate as the single crystal piezoelectric thin plate.

Referring to FIG. 15, a surface acoustic wave device according to the first specific example includes a non-piezoelectric substrate 52 made of boron, amorphous carbon, or graphite, and a single crystal piezoelectric thin plate 21 made of single crystal lithium niobate of 41-degree Y-cut and X-propagation. The non-piezoelectric 52 and the single crystal piezoelectric thin plate 21 are formed into a composite structure by the above-described direct bonding.

The surface acoustic wave device further includes interdigital transducers 30 and 30' disposed on the single crystal piezoelectric thin plate 21. In FIG. 15, the interdigital transducers 30 and 30' are shown in a simplified manner.

The lithium niobate of 41-degree Y-cut and X-propagation has an electromechanical coupling factor of 17.2%, and a sound velocity of 4,792 m/sec. The boron, amorphous carbon, and graphite for the non-piezoelectric substrate 52 have sound velocities of 10,000 m/sec., about 10,000 m/sec., and 10,000 to 15,000 m/sec., respectively.

In the composite single crystal piezoelectric substrate which is made composite by the direct bonding, the thickness of the single crystal piezoelectric thin plate 21 can be set to be an adequate value in accordance with the wavelength of a surface acoustic wave to be used, thereby obtaining characteristics in which the substantial electromechanical coupling factor and sound velocity are different from those of the piezoelectric materials.

When the interdigital transducers are excited at about 200 MHz, for example, the intervals of the interdigital transducers are set to be ¼ of the wavelength, and the thickness of the single crystal piezoelectric thin plate 21 is set to be ¼ of to 1 times. In this configuration, both the electromechanical coupling factor and the sound velocity are obtained as values different from those obtained in the lithium niobate of 41-degree Y-cut and X-propagation used as the single crystal piezoelectric thin plate 21, and also those obtained in the boro-silicate glass used as the non-piezoelectric substrate 52.

Specifically, for example, the factor and the speed are obtained as intermediate values. When the thickness of the single crystal piezoelectric thin plate 21 is set to be about ½ of to 1 time the wavelength, an electromechanical coupling factor of 1 to 5% and a sound velocity of 5,000 to 12,000 m/sec. are obtained. In this case, both the electromechanical coupling factor and the sound velocity are obtained as intermediate values of those of the piezoelectric material and the insulating material. As the electromechanical coupling factor is relatively large and the sound velocity is relatively high, thereby realizing a surface acoustic wave device which is suitable for, for example, a filter used for high frequency.

The effect of the composite structure is remarkable particularly when the thickness of the single crystal piezoelectric thin plate 21 is set to be ½ of to 1 time the wavelength. The example can attain effects mainly on the electromechanical coupling factor and the sound velocity.

EXAMPLE 3-3

Figure 16:
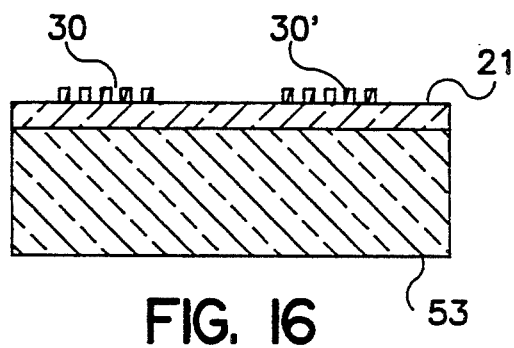
FIG. 16 shows a cross-sectional view for illustrating the configuration of a third specific example of Example 3.

FIG. 16 shows a cross-section for illustrating the configuration of a third specific example of Example 3. In the third specific example, lithium niobate is used as the single crystal piezoelectric thin plate, and glass having a smaller thermal expansion coefficient than that of the single crystal piezoelectric substrate is used as the non-piezoelectric substrate.

Referring to FIG. 16, a surface acoustic wave device according to the first specific example includes a non-piezoelectric substrate 53 made of glass having small thermal expansion coefficient, and a single crystal piezoelectric thin plate 21 made of single crystal lithium niobate of 41-degree Y-cut and X-propagation. The non-piezoelectric 53 and the single crystal piezoelectric thin plate 21 are formed into a composite structure by the above-described direct bonding.

The surface acoustic wave device further includes interdigital transducers 30 and 30' disposed on the single crystal piezoelectric thin plate 21. In FIG. 15, the interdigital transducers 30 and 30' are shown in a simplified manner.

In the example, the thickness of the single crystal piezoelectric thin plate 21 may be greater than the wavelength of a surface acoustic wave to be used.

In this configuration, when the material of the non-piezoelectric substrate 53 is selected so that its thermal expansion coefficient is smaller than that of the material of the single crystal piezoelectric thin plate 21, it is possible to obtain a resulting surface acoustic wave device having an excellent temperature dependence.

For example, lithium niobate of a thickness of 100 μm (the thermal expansion coefficient depends on the crystal orientation and is 7.5 to 15 ppm/° C.) may be used as the single crystal piezoelectric substrate, and glass of a thickness of 1 mm and a thermal expansion coefficient of 4 ppm/° C. is used as the glass substrate. In this case, even when the thickness of the piezoelectric material is several times the wavelength of a surface acoustic wave to be used, the temperature dependence can be improved by 10 to 20% without impairing the electromechanical coupling factor.

It is considered that this phenomenon is caused by the following reason. Since the single crystal piezoelectric thin plate 21 and the non-piezoelectric substrate 53 are bonded in the order of an atom by direct bonding, a compression stress due to the difference of the thermal expansion coefficients is applied to the single crystal piezoelectric thin plate 21 when the temperature is raised, thereby improving the temperature dependence.

Therefore, a surface acoustic wave device in which the temperature dependence is improved while the electromechanical coupling factor is substantially maintained can be obtained by using a supporting substrate having a thermal expansion coefficient which is smaller than that of the single crystal piezoelectric thin plate.

For example, the thermal expansion coefficient of lithium tantalate is 4 to 16 ppm/° C., that of lithium borate is 4 to 13 ppm/° C., and that of quartz is 7.5 to 14 ppm/° C. In contrast, glass having a thermal expansion coefficient of 4 to 10 ppm/° C. can be freely selected as the glass substrate. When lithium tantalate, lithium borate, or quartz directed to a specific crystal orientation is used as the single crystal piezoelectric substrate and a glass substrate having a thermal expansion coefficient which is smaller than that in the crystal orientation, therefore, it is possible to attain the same effect that of the embodiment. This effect can be attained even when the substrate for holding is not a non-piezoelectric substrate.

In the above, specific combinations of lithium niobate, lithium tantalate, lithium borate, and quartz as the single crystal piezoelectric materials, and glass, boron, amorphous carbon, and graphite as the non-piezoelectric substrate have been described. Also in other combinations, composite single crystal piezoelectric substrates having various electromechanical coupling factors, sound velocities, and temperature dependences in accordance with the combinations can be obtained.

EXAMPLE 4

FIG. 17(a) is a perspective view of a fourth example of the configuration of the surface acoustic wave device of the invention, and FIG. 17(b) shows a section structure of the A-A' portion in FIG. 17(a).

Referring to FIGS. 17(a) and 17(b), the surface acoustic wave device of the invention includes a non-piezoelectric substrate 50, a single crystal piezoelectric thin plate 20, and interdigital transducers 30 and 30'. The surface acoustic wave device further includes an inorganic thin film layer 40 formed between the non-piezoelectric substrate 50 and the single crystal piezoelectric thin plate 20. The interdigital transducers 30 and 30' are disposed on the single crystal piezoelectric thin plate 20. In FIGS. 17(a) and 17(b), the interdigital transducers 30 and 30' are shown in a simplified manner for clarity, as the actual construction of the interdigital transducers 30 and 30' are well known.

Suitable substrates for the non-piezoelectric substrate 50 are a substrate having a low sound velocity such as a glass substrate, a substrate having low thermal expansion coefficient, and a substrate having high sound velocity such as a boron substrate, amorphous carbon substrate, or a graphite substrate.

Suitable materials for the single crystal piezoelectric thin plate 20 are lithium niobate, lithium tantalate, lithium borate, and quartz.

Suitable materials for the inorganic thin film layer 40 are silicon, silicon compounds such as silicon oxide and silicon nitride, and boron compounds such as borate compounds. The thickness of the inorganic thin film layer 40 is set to be sufficiently smaller than the wavelength of the surface acoustic wave to be used. Specifically, the thickness is preferably less than the wavelength or 1/10 of the wavelength of the surface acoustic wave to be used.

As is explained in Example 1, the device functions as a surface acoustic wave device in the following way. A high frequency signal is applied to the interdigital transducer 30 so that a surface acoustic wave is excited in the piezoelectric portion in the vicinity of the interdigital transducer 30. The surface acoustic wave propagates to the other interdigital transducer 30' through the lamination structure, and is then inverted into an electric signal in the piezoelectric portion under the interdigital transducer 30'. In this description, a fundamental configuration of a surface acoustic wave device using interdigital transducers is illustrated. When such a device is actually used in a high frequency filter or a resonator, the number of the interdigital transducers is increased and the configuration is modified.

The lamination structure of the non-piezoelectric substrate 50, the single crystal piezoelectric thin plate 20, and the inorganic thin film layer 40 are obtained in the following way. Two single crystal piezoelectric substrates at least one of which has the inorganic thin film layer 40 thereon are prepared, and the surfaces of the substrates are subjected to flattening, mirror-polishing, cleaning, and hydrophilic processes. The two substrates are then bonded by direct bonding with each other by stacking them and conducting a heat treatment, so as to form the lamination. Thereafter, the single crystal piezoelectric thin plate 20 is polished and thinned to a predetermined thickness. The direct bonding has explained in Example 1.

After forming a lamination structure consisting of the non-piezoelectric substrate 50, the single crystal piezoelectric thin plate 20, and the inorganic thin film layer 40, the interdigital transducers 30 and 30' are formed on the single crystal piezoelectric thin plate 20 by a lithographic technique. The interdigital transducers 30 and 30' are made of aluminum, gold, or the like.

Hereinafter, a production process for the direct bonding will be described. A specific example will be described in which single crystal lithium niobate, lithium tantalate, lithium borate, or quartz is used as a material of the single crystal piezoelectric substrate and in which silicon, silicon oxide, silicon nitride, and boro-silicate glass is used as a material of the inorganic thin film layer 40.

The surfaces of the non-piezoelectric substrate and the single crystal piezoelectric substrates which are to be directly bonded are flattened, mirror-polished, and cleaned. As required, the surface layers are etched away. When lithium niobate, lithium tantalate, or quartz is to be etched, a hydrofluoric etchant is used. When lithium borate is to be etched, a weak acid is used. When glass, boron, amorphous carbon, graphite is to be etched, a hydrofluoric etchant is used.

Then, the inorganic thin film layer 40 is formed on the surface portion of one of the non-piezoelectric substrate and the single crystal piezoelectric substrates by a thin-film technique. The surface portion will be a junction face of direct bonding. The inorganic thin film layer 40 can be formed from each material mentioned above by a Sputtering method, a CVD method, or a vacuum evaporation method. The thickness of the inorganic thin film layer 40 is set to be sufficiently larger than the wavelength of the surface acoustic wave to be used. Specifically, the thickness is preferably less than ½ of the wavelength of the surface acoustic wave to be used, more preferably less than 1/10 of the wavelength, for example, 0.1 to 1 μm.

Then, the surfaces of the inorganic thin film and the single crystal piezoelectric substrates are flattened, mirror-polished, and cleaned. In the case where the inorganic thin film 40 formed on the single crystal piezoelectric substrate is sufficiently flat and clean, this process step is not necessary. This is because the single crystal piezoelectric substrate is flatted, mirror-polished, and cleaned before the formation of the inorganic thin film. The following process steps are the same as those explained in Example 1.

Specifically, the materials are soaked in an ammonia-hydrogen peroxide solution to cause a hydroxyl group to easily be attached to the surfaces or make the surfaces hydrophilic. Thereafter, the surfaces are cleaned sufficiently by pure water, resulting in hydroxyl groups be attached to the surfaces of the single crystal piezoelectric substrates. The two single crystal piezoelectric substrates are stacked together under this state, so that the two substrates are caused to stick to each other mainly by van der Waals forces. Although the substrates are strongly bonded to each other under this state, they are further subjected under this state to a heat treatment at a temperature of 100° C. or higher for several tens minutes to several tens hours, whereby components constituting water are gradually removed away from the interface. Accompanying this heat treatment, bonding processes proceed from bonding of hydroxyl groups which mainly consists of hydrogen bonds to bonding which relates to oxygen, hydrogen, and atoms constituting the substrates, and junction of atoms constituting the substrates gradually proceeds, with the result that the junction is extremely strengthened. Particularly, as the inorganic thin film contains silicon, covalent bonding proceeds to further enhance the bonding.

The temperature of the heat treatment is preferably set to be within a range of 200° to 1,000° C. and in which the characteristics of the piezoelectric materials are not lost.

In this manner, the junction can be attained with a high precision and without disposing an inclusion in the interface. Therefore, the loss in the propagation of a surface acoustic wave is very small. In the case where the thickness of the inorganic thin film is sufficiently smaller than the wavelength of the surface acoustic wave to be used, the loss in the propagation of the surface acoustic wave is very small at the inorganic thin film, and which brings no problem in practical use. Therefore, the surface acoustic wave device of this example has the same advantages as those of the device of Example 1.

The example is characterized in that the direct bonding interface is provided with an inorganic thin film layer unlike Example 3. This configuration can produce two advantages as follows.

The first advantage is that, even when there is a little amount of dust during the bonding, the dust is introduced into the inorganic thin film layer during a process of direct bonding and therefore the production yield of the bonding process is improved.

The second advantage is that interdigital transducers can easily be embedded in the inorganic thin film layer and therefore the flexibility of design as a surface acoustic wave device is further enhanced.

FIGS. 18(a) through 18(d) show an example having a configuration in which interdigital transducers are embedded in the inorganic thin film layer.

In FIG. 18(a), an inorganic thin film layer 40 is formed between a non-piezoelectric substrate 50 and a single crystal piezoelectric thin plate 20. Interdigital transducers 31 and 31' are formed on the non-piezoelectric substrate 50 and embedded in the inorganic thin film layer 40. Although not shown, the ends of the interdigital transducers 31 and 31' are exposed so as to be connected to an external circuit.

FIG. 18(b) shows an example in which interdigital transducers 32 and 32' are formed on the side of the single crystal piezoelectric thin plate 20, the side being in contact with the inorganic thin film layer 40.

FIG. 18(c) shows an example in which an earth electrode 33 is disposed on the upper face of the single crystal piezoelectric thin plate 20 in the configuration of FIG. 18(a).

FIG. 18(d) shows an example in which the earth electrode 33 is disposed on the upper face of the single crystal piezoelectric thin plate 20 in the configuration of FIG. 18(b).

FIG. 18(e) shows an example in which an earth electrode 34 is formed on the non-piezoelectric substrate 50 with being embedded in the inorganic thin film layer 40 in the configuration of FIGS. 17(a) and 17(b).

Differences of properties depending on the differences in electrode configuration will be qualitatively described below. Basically, the properties are dependent on the portion of the upper and lower substrates at which the electric field concentrates. In these configurations, easy concentration of the electric field into the single crystal piezoelectric thin plate occurs in the order of FIG. 18(e), FIGS. 17(a) and 17(b), FIGS. 18(d) and 18(c), and FIGS. 18(b) and 18(a). Qualitatively, piezoelectric characteristics which are mixtures of the characteristics of the respective pair of upper and lower substrates and can be arranged substantially in this order are obtained as those of the laminated structures.

In the case of such an electrode configuration, therefore, a surface acoustic wave is excited in a different manner even when the types and thicknesses of the piezoelectric materials are the same as those of FIGS. 17(a) and 17(b), with the result that the obtained piezoelectric characteristics are naturally different from those of FIGS. 17(a) and 17(b). Specifically, for example, an effect that the electromechanical coupling factor is large can be attained.

The configuration of FIGS. 18(a) through 18(e) can be obtained by subjecting the surface of the single crystal piezoelectric substrate to flattening, mirror-polishing, cleaning, and cleaning processes, then forming the interdigital transducers, forming on the electrodes the inorganic thin film layer by one of various thin film forming techniques in the manner described above, and conducting the direct bonding in the above-mentioned production process. When the interdigital transducers are to be embedded, the inorganic thin film layer must have a sufficiently high resistance.

Also in the configuration of FIGS. 17(a) and 17(b) or FIGS. 18(a) through 18(e), surface acoustic wave devices composed of a wide variety of composite single crystal piezoelectric substrates and having a high flexibility of design can be obtained by adequately combining the piezoelectric characteristics, the sound velocities, the temperature dependences, and the thermal expansion coefficients of the non-piezoelectric substrate 50 and the single crystal piezoelectric thin plate 20.

EXAMPLE 4-1

Figure 19:
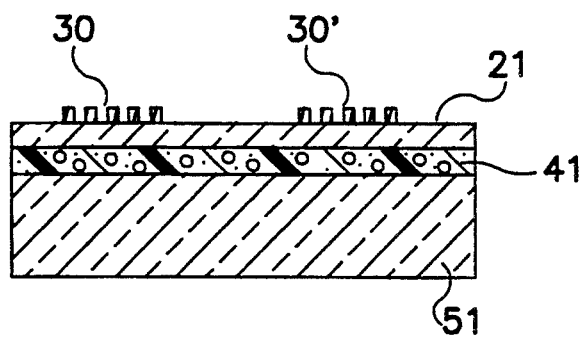
FIG. 19 shows a cross-sectional view for illustrating the configuration of a first specific example of Example 4.

FIG. 19 shows the configuration of a first specific example of Example 4. In the example, glass having low sound velocity is used as a material of a non-piezoelectric substrate, lithium niobate as a material of the single crystal piezoelectric thin plate, and silicon as a material of the inorganic thin film layer.

In FIG. 19, an inorganic thin film layer 41 is formed between an insulting substrate 51 and a single crystal piezoelectric thin plate 21. The non-piezoelectric 51 is made of boro-silicate glass, the single crystal piezoelectric thin plate 21 is made of single crystal lithium niobate of 41-degree Y-cut and X-propagation. The inorganic thin film layer 41 is made of amorphous silicon or polisilicon and formed on the non-piezoelectric substrate 51 by a sputtering method, a chemical vapor deposition method, or a vacuum deposition method.

The single crystal piezoelectric thin plate 21 is made composite at the interface between the single crystal piezoelectric thin plate 21 and the inorganic thin film layer 41 by the above-described direct bonding. The interdigital transducers 30 and 30' are disposed on the single crystal piezoelectric thin plate 21 in the same manner as Example 1-1. In the FIG. 19, the interdigital transducers 30 and 30' are shown in a simplified manner.

Also in the example, when the thickness of the inorganic thin film layer 41 is sufficiently reduced (½ of the wavelength or less, more preferably 1/10 of the wavelength or less), an effect which is the substantially same as that of Example 3-1 can be attained on the flexibility of design of the piezoelectric characteristics.

In the example, the existence of the inorganic thin film layer 41 allows the production process to be advantageously conducted as described above and increases the flexibility of the arrangement of the interdigital transducers 30 and 30'.

EXAMPLE 4-2

Figure 20:
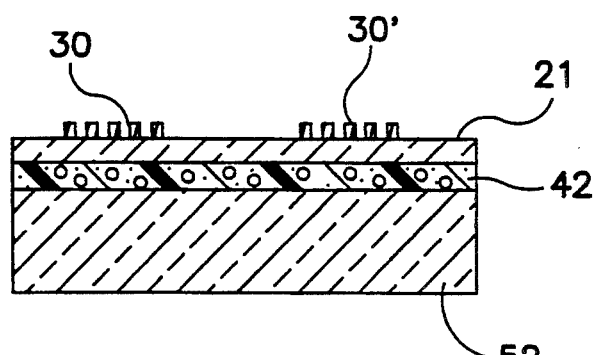
FIG. 20 shows a cross-sectional view for illustrating the configuration of a second specific example of Example 4.

FIG. 20 shows the configuration of a second specific example of Example 4. In the example, boron, amorphous carbon, or graphite having high sound velocity is used as a material of a non-piezoelectric substrate, lithium niobate as a material of the single crystal piezoelectric thin plate, and silicon oxide or silicon nitride as a material of the inorganic thin film layer.

In FIG. 20, an inorganic thin film layer 42 is formed between a non-piezoelectric substrate 52 and a single crystal piezoelectric thin plate 21. The non-piezoelectric 52 is made of boron, amorphous carbon, or graphite, the single crystal piezoelectric thin plate 21 is made of single crystal lithium niobate of 41-degree Y-cut and X-propagation. The inorganic thin film layer 42 is made of amorphous silicon or polisilicon and formed on the non-piezoelectric substrate 52 by a sputtering method, a chemical vapor deposition method, or a vacuum deposition method.

The single crystal piezoelectric thin plate 21 is made composite at the interface between the single crystal piezoelectric thin plate 21 and the inorganic thin film layer 42 by the above-described direct bonding. The interdigital transducers 30 and 30' are disposed on the single crystal piezoelectric thin plate 21 in the same manner as Example 1-1. In the FIG. 20, the interdigital transducers 30 and 30' are shown in a simplified manner.

Also in the example, when the thickness of the inorganic thin film layer 41 is sufficiently reduced (½ of the wavelength or less, more preferably 1/10 of the wavelength or less), an effect which is substantially the same as that of Example 3-2 can be attained on the flexibility of design of the piezoelectric characteristics.

EXAMPLE 4-3

Figure 21:
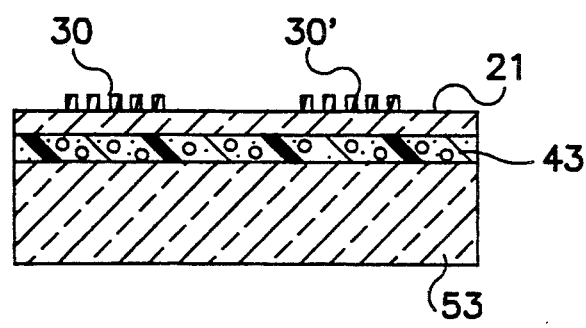
FIG. 21 shows a cross-sectional view for illustrating the configuration of a third specific example of Example 4.

FIG. 21 shows the configuration of a third specific example of Example 4. In the example, lithium niobate is used as a material of the single crystal piezoelectric thin plate, glass having smaller thermal expansion coefficient than that of the single crystal piezoelectric thin plate as a material of a non-piezoelectric substrate, and a boro-silicate compounds as a material of the inorganic thin film layer.

In FIG. 21, an inorganic thin film layer 43 is formed between a non-piezoelectric substrate 53 and a single crystal piezoelectric thin plate 21. The non-piezoelectric 53 is made of glass having a smaller thermal expansion coefficient than that of the single crystal piezoelectric thin plate, the single crystal piezoelectric thin plate 21 is made of single crystal lithium niobate of 41-degree Y-cut and X-propagation. The inorganic thin film layer 43 is made of boro-silicate glass and formed on the non-piezoelectric substrate 53 by a sputtering method, a chemical vapor deposition method, or a vacuum deposition method.

The single crystal piezoelectric thin plate 21 is made composite at the interface between the single crystal piezoelectric thin plate 21 and the inorganic thin film layer 43 by the above-described direct bonding. The interdigital transducers 30 and 30' are disposed on the single crystal piezoelectric thin plate 21 in the same manner as Example 1-1. In FIG. 21, the interdigital transducers 30 and 30' are shown in a simplified manner.

Also in the example, when the thickness of the inorganic thin film layer 43 is sufficiently reduced (½ of the wavelength or less, more preferably 1/10 of the wavelength or less), an effect which is the substantially same as that of Example 3-3 can be attained on the flexibility of design of the piezoelectric characteristics.

In the above, specific combinations of lithium niobate, lithium tantalate, lithium borate, and quartz as the single crystal piezoelectric materials, silicon, silicon oxide, silicon nitride, and boro-silicate glass as the inorganic thin film layer, and glass, boron, amorphous carbon, and graphite as the non-piezoelectric substrate have been described. Also in other combinations, composite single crystal piezoelectric substrates having various electromechanical coupling factors, sound velocities, and temperature dependences in accordance with the combinations can be obtained.

In Examples 1 through 4, a surface acoustic wave device having two piezoelectric substrates or having a piezoelectric substrate and a non-piezoelectric substrate has been explained as a specific example of the invention. However, a surface acoustic wave device of the invention may further have other single crystal piezoelectric substrates or which are bonded by direct bonding so as to form a lamination structure having desired an electromechanical coupling factor, a sound velocity, and a temperature dependence.

In Examples 1 and 2, it is explained that an inorganic thin film layer is formed on a single crystal piezoelectric substrate or a non-piezoelectric substrate and that a single crystal piezoelectric thin plate is bonded to the inorganic thin film layer by direct bonding. Alternatively, an inorganic thin film layer may be formed on a single crystal piezoelectric thin film layer and a single crystal piezoelectric substrate then may be bonded to the inorganic thin film layer by direct bonding to form a lamination structure consisting of the single crystal piezoelectric thin plate, the inorganic thin film layer, and the single crystal piezoelectric substrate. Moreover, inorganic thin film layers may be formed on both a single crystal piezoelectric thin plate and a single crystal piezoelectric substrate, and then, the surfaces of the two inorganic thin film layers are bonded to each other by direct bonding.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A surface acoustic wave device comprising:
a single crystal piezoelectric substrate;
a single crystal piezoelectric thin plate formed on said single crystal piezoelectric substrate, said single crystal piezoelectric thin plate being bonded to said single crystal piezoelectric substrate through at least one of covalent bonding with oxygen atoms and hydrogen bonding with hydroxyl groups by direct bonding; and
interdigital transducers formed on said single crystal piezoelectric thin plate, for exciting a surface acoustic wave in at least said single crystal piezoelectric thin plate.

2. A surface acoustic wave device according to claim 1, wherein surfaces of said single crystal piezoelectric thin plate and said single crystal piezoelectric substrate are subjected to flattening, mirror-polishing, cleaning, and hydrophilic processes and said single crystal piezoelectric thin plate and said single crystal piezoelectric substrate constitute a lamination structure by stacking said single crystal piezoelectric thin plate and said single crystal piezoelectric substrate and then by conducting a heat treatment.

3. A surface acoustic wave device according to claim 1, wherein said single crystal piezoelectric thin plate has a different sound velocity from that of said single crystal piezoelectric substrate.

4. A surface acoustic wave device according to claim 1, wherein the temperature dependence of the sound velocity of said single crystal piezoelectric thin plate is greater than that of said single crystal piezoelectric substrate.

5. A surface acoustic wave device according to claim 1, wherein the electromechanical coupling factor of said single crystal piezoelectric thin plate is greater than that of said single crystal piezoelectric substrate.

6. A surface acoustic wave device according to claim 1, wherein each of said single crystal piezoelectric substrate and said single crystal piezoelectric thin plate is made of a material selected from the group consisting of lithium niobate, lithium tantalate, lithium borate, and quartz.

7. A surface acoustic wave device according to claim 6, wherein said single crystal piezoelectric thin plate is made of lithium niobate, and said single crystal piezoelectric substrate is made of quartz.

8. A surface acoustic wave device according to claim 1, wherein the thickness of said single crystal piezoelectric thin plate is less than three times of the wavelength of said surface acoustic wave excited therein.

9. A surface acoustic wave device comprising:
a single crystal piezoelectric substrate;
a single crystal piezoelectric thin plate;
an inorganic thin film layer formed between said single crystal piezoelectric substrate and said single crystal piezoelectric thin plate, at least one of said single crystal piezoelectric substrate and said single crystal piezoelectric thin plate being bonded to said inorganic thin film layer through at least one of covalent bonding with oxygen atoms and hydrogen bonding with hydroxyl groups by direct bonding; and
interdigital transducers being in contact with one of said single crystal piezoelectric thin plate and said single crystal piezoelectric substrate, said interdigital transducers exciting a surface acoustic wave in at least said single crystal piezoelectric thin plate.

10. A surface acoustic wave device according to claim 9, wherein said inorganic thin film layer has a thickness equal to or less than half of the wavelength of said surface acoustic wave.

11. A surface acoustic wave device according to claim 9, wherein said inorganic thin film layer is made of materials including silicon.

12. A surface acoustic wave device according to claim 9, wherein said interdigital transducers are formed between said inorganic thin film layer and one of said single crystal piezoelectric thin plate and said single crystal piezoelectric substrate.

13. A surface acoustic wave device according to claim 9, further comprising a ground electrode being in contact with one of said single crystal piezoelectric thin plate and said single crystal piezoelectric substrate.

14. A surface acoustic wave device according to claim 11, wherein said-inorganic thin film layer is made of one of silicon oxide and silicon nitride.

15. A surface acoustic wave device according to claim 9, wherein the sound velocity of said single crystal piezoelectric thin plate is different from that of said single crystal piezoelectric substrate.

16. A surface acoustic wave device according to claim 15, wherein the temperature dependence of said sound velocity of said single crystal piezoelectric thin plate is greater than that of said single crystal piezoelectric substrate.

17. A surface acoustic wave device according to claim 15, wherein the electromechanical coupling factor of said single crystal piezoelectric thin plate is greater than that of said single crystal piezoelectric substrate.

18. A surface acoustic wave device according to claim 9, wherein each of said single crystal piezoelectric thin plate and said single crystal piezoelectric substrate is made of a material selected from the group consisting of lithium niobate, lithium tantalate, lithium borate, and quartz.

19. A surface acoustic wave device according to claim 18, wherein said single crystal piezoelectric thin plate is made of lithium niobate, and said single crystal piezoelectric substrate is made of quartz.

20. A surface acoustic wave device according to claim 9, wherein said single crystal piezoelectric thin plate has a thickness equal to or less than three times of the wavelength of said surface acoustic wave.

21. A surface acoustic wave device according to claim 9, wherein a surface of said inorganic thin film layer and at least one of a surface of said single crystal piezoelectric thin plate and a surface of said single crystal piezoelectric substrate are subjected to flattening, mirror-polishing, cleaning, and hydrophilic processes and said single crystal piezoelectric thin plate, said single crystal piezoelectric substrate, and said inorganic thin film layer constitute a laminated structure by stacking said single crystal piezoelectric thin plate and said single crystal piezoelectric substrate and then by conducting a heat treatment.

22. A surface acoustic wave device comprising:
a non-piezoelectric substrate;
a single crystal piezoelectric thin plate formed on said non-piezoelectric, said single crystal piezoelectric thin plate being bonded to said non-piezoelectric through at least one of covalent bonding with oxygen atoms and hydrogen bonding with hydroxyl groups by direct bonding; and
interdigital transducers formed on said single crystal piezoelectric thin plate, for exciting a surface acoustic wave in at least said single crystal piezoelectric thin plate.

23. A surface acoustic wave device according to claim 22, wherein said single crystal piezoelectric thin plate has a lower sound velocity than that of said non-piezoelectric.

24. A surface acoustic wave device according to claim 22, wherein said single crystal piezoelectric thin plate has a higher sound velocity than that of said non-piezoelectric.

25. A surface acoustic wave device according to claim 22, wherein said single crystal piezoelectric thin plate is made of a material selected from the group consisting of lithium niobate, lithium tantalate, lithium borate, and quartz.

26. A surface acoustic wave device according to claim 22, wherein said non-piezoelectric is made of a material selected from the group consisting of boron, amorphous carbon, and graphite.

27. A surface acoustic wave device according to claim 22, wherein said single crystal piezoelectric thin plate has a thickness equal to or less than the wavelength of said surface acoustic wave excited therein.

28. A surface acoustic wave device according to claim 22, wherein said single crystal piezoelectric thin plate has a greater thermal expansion coefficient than that of said non-piezoelectric.

29. A surface acoustic wave device according to claim 22, wherein surfaces of said single crystal piezoelectric thin plate and said non-piezoelectric are subjected to flattening, mirror-polishing, cleaning, and hydrophilic processes and said single crystal piezoelectric thin plate and said non-piezoelectric constitute a laminated structure by stacking said single crystal piezoelectric thin plate and said insulating substrate and then by conducting a heat treatment.

30. A surface acoustic wave device comprising:
a non-piezoelectric substrate;
a single crystal piezoelectric thin plate;
an inorganic thin film layer formed between said non-piezoelectric and said single crystal piezoelectric thin plate, at least one of said non-piezoelectric and said single crystal piezoelectric thin plate being bonded to said inorganic thin film layer through at least one of covalent bonding with oxygen atoms and hydrogen bonding with hydroxyl groups by direct bonding; and
interdigital transducers being in contact with one of said single crystal piezoelectric thin plate and said non-piezoelectric, said interdigital transducers exciting a surface acoustic wave in at least said single crystal piezoelectric thin plate.

31. A surface acoustic wave device according to claim 30, wherein said inorganic thin film layer has a thickness equal to or less than half of the wavelength of said surface acoustic wave.

32. A surface acoustic wave device according to claim 30, wherein said inorganic thin film layer is made of materials including silicon.

33. A surface acoustic wave device according to claim 30, wherein said interdigital transducers are formed between said inorganic thin film layer and one of said single crystal piezoelectric thin plate and said non-piezoelectric.

34. A surface acoustic wave device according to claim 30, further comprising a ground electrode being in contact with one of said single crystal piezoelectric thin plate and said non-piezoelectric.

35. A surface acoustic wave device according to claim 30, wherein said inorganic thin film layer is made of one of silicon oxide and silicon nitride.

36. A surface acoustic wave device according to claim 30, wherein said single crystal piezoelectric thin plate has a lower sound velocity than that of said non-piezoelectric.

37. A surface acoustic wave device according to claim 30, wherein said single crystal piezoelectric thin plate has a higher sound velocity than that of said non-piezoelectric.

38. A surface acoustic wave device according to claim 30, wherein said single crystal piezoelectric thin plate is made of a material selected from the group consisting of lithium niobate, lithium tantalate, lithium borate, and quartz.

39. A surface acoustic wave device according to claim 30, wherein said non-piezoelectric is made of a material selected from the group consisting of boron, amorphous carbon, and graphite.

40. A surface acoustic wave device according to claim 30, wherein said single crystal piezoelectric thin plate has a thickness equal to or less than the wavelength of said surface acoustic wave excited therein.

41. A surface acoustic wave device according to claim 30, wherein said single crystal piezoelectric thin plate has a greater thermal expansion coefficient than that of said non-piezoelectric.

42. A surface acoustic wave device according to claim 30, wherein a surface of said inorganic thin film layer and at least one of a surface of said single crystal piezoelectric thin plate and a surface of said non-piezoelectric are subjected to flattening, mirror-polishing, cleaning, and hydrophilic processes and said single crystal piezoelectric thin plate, said non-piezoelectric, and said inorganic thin film layer constitute a laminated structure by stacking said single crystal piezoelectric thin plate and said non-piezoelectric and then by conducting a heat treatment.

* * * * *